(12) United States Patent
Arai et al.

(10) Patent No.: US 11,763,979 B2
(45) Date of Patent: Sep. 19, 2023

(54) LAMINATED COIL COMPONENT

(71) Applicant: TAIYO YUDEN CO., LTD., Tokyo (JP)

(72) Inventors: Takayuki Arai, Tokyo (JP); Naoya Terauchi, Tokyo (JP); Tomoo Kashiwa, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 613 days.

(21) Appl. No.: 16/912,099

(22) Filed: Jun. 25, 2020

(65) Prior Publication Data

US 2020/0411228 A1 Dec. 31, 2020

(30) Foreign Application Priority Data

Jun. 28, 2019 (JP) ................................. 2019-120684

(51) Int. Cl.
*H01F 27/28* (2006.01)
*H01F 27/29* (2006.01)
(Continued)

(52) U.S. Cl.
CPC ....... *H01F 27/2804* (2013.01); *H01F 27/292* (2013.01); *H01F 41/0233* (2013.01);
(Continued)

(58) Field of Classification Search
CPC ............... H01F 27/2804; H01F 27/292; H01F 41/0233; H01F 41/041; H01F 2027/2809;
(Continued)

(56) References Cited

U.S. PATENT DOCUMENTS 5,515,022 A * 5/1996 Tashiro ............... H01F 17/0013
336/200
2011/0285494 A1 * 11/2011 Jeong .................. H01F 17/0013
336/200
(Continued)

FOREIGN PATENT DOCUMENTS

JP 2014-154839 A 8/2014
KR 20140021711 A * 2/2014
(Continued)

OTHER PUBLICATIONS

Notice of Reasons for Refusal dated Apr. 4, 2023, issued in corresponding Japanese Patent Application No. 2019-120684, with English translation (12 pgs.).

*Primary Examiner* — Tuyen T Nguyen
(74) *Attorney, Agent, or Firm* — Pillsbury Winthrop Shaw Pittman, LLP

(57) ABSTRACT

A coil component 1 includes a base body 10 having a mounting surface 10b, a coil conductor 25 wound around a coil axis X through a plurality of layers in the base body 10, where the coil conductor 25 has a first end 25a and a second end 25b, external electrodes 21 and 22 provided on the mounting surface 10b, a lead-out conductor 26 connecting the first end 25a of the coil conductor 25 and the external electrode 21, and a lead-out conductor 27 connecting the second end 25b of the coil conductor 25 and the external electrode 22. At least a portion of the lead-out conductor 26 is positioned within a first region R1 inside the coil conductor 25 in a radial direction when seen in a direction of the coil axis X.

11 Claims, 22 Drawing Sheets

(51) Int. Cl.
  *H05K 1/18* (2006.01)
  *H01F 41/04* (2006.01)
  *H01F 41/02* (2006.01)

(52) U.S. Cl.
  CPC ........... *H01F 41/041* (2013.01); *H05K 1/181* (2013.01); *H01F 2027/2809* (2013.01); *H05K 2201/1003* (2013.01)

(58) Field of Classification Search
  CPC ... H01F 41/043; H01F 17/0013; H05K 1/181; H05K 2201/1003; H05K 2201/10636; Y02P 70/50
  See application file for complete search history.

(56) References Cited

U.S. PATENT DOCUMENTS

2013/0214888 A1    8/2013    Nogi et al.
2017/0025220 A1    1/2017    Nakaniwa

FOREIGN PATENT DOCUMENTS

WO    2011/132626 A1    10/2011
WO    2015/156051 A1    10/2015

\* cited by examiner

LAMINATED COIL COMPONENT

CROSS-REFERENCE TO RELATED APPLICATIONS

This application is based on and claims the benefit of priority from Japanese Patent Application Serial No. 2019-120684 (filed on Jun. 28, 2019), the contents of which are hereby incorporated by reference in their entirety.

TECHNICAL FIELD

The present invention relates to a laminated coil component.

BACKGROUND

In the conventional art, laminated coil components are known that include a base body made of a magnetic material and a coil conductor having a plurality of conductor patterns stacked in the base body. There is a demand for smaller laminated coil components. In smaller laminated coil components, stricter limitations are placed on the positioning of the coil conductor within the magnetic base body and the lead-out conductors connecting the coil conductor and external electrodes. Depending on the positioning of the coil and lead-out conductors, the magnetic flux may concentrate in a specific region in the magnetic base body. In the region with the concentrated magnetic flux in the base body, magnetic saturation is likely to take place. Accordingly, the magnetic flux concentration in a specific region in the base body result in degradation in DC bias characteristics of the laminated coil components.

Japanese Patent Application Publication No. 2014-154839 (The '839 Publication) proposes that the shape and positioning of a coil conductor be improved to reduce magnetic saturation in a laminated coil component.

The '839 Publication also proposes that the positioning of coil and lead-out conductors be improved in a laminated coil component having an external electrode arranged on the mounting surface thereof. In a laminated coil component having an external electrode arranged on the mounting surface thereof, a lead-out conductor needs to be provided in the base body and to extend to the mounting surface from the end of the coil conductor. This leads to stricter limitations on the positioning of the coil and lead-out conductors.

As described above, coil components require reduced magnetic saturation. One object of the present invention is to provide a novel coil component capable of achieving reduced magnetic saturation in a base body. Other objects of the present invention will be made apparent through the entire description of the specification.

SUMMARY

One embodiment of the present invention provides a coil component including a base body having a mounting surface, a coil conductor wound around a coil axis through a plurality of layers in the base body, where the coil conductor has a first end and a second end, and the second end is closer to the mounting surface than the first end is, a first external electrode provided on the mounting surface, a second external electrode provided on the mounting surface, where the second external electrode is spaced from the first external electrode, a first lead-out conductor connecting the first end of the coil conductor and the first external electrode, and a second lead-out conductor connecting the second end of the coil conductor and the second external electrode. In one embodiment, at least a portion of the first lead-out conductor is positioned within a first region in the base body, and the first region is inside the coil conductor in a radial direction when seen in a direction of the coil axis.

In one embodiment of the present invention, the first lead-out conductor is arranged in such a manner that the first lead-out conductor does not overlap a second region in the base body, and the second region is outside the coil conductor in the radial direction when seen in the direction of the coil axis.

In one embodiment of the present invention, a ratio in area of the first region to the second region, which is outside the coil conductor in the radial direction when seen in the direction of the coil axis, is 0.6 or higher.

In one embodiment of the present invention, an insulator is provided in an overlap region in which the first lead-out conductor overlaps the coil conductor when seen in the direction of the coil axis, where the overlap region is positioned between the coil conductor and the first lead-out conductor.

In one embodiment of the present invention, the first and second external electrodes are in contact with the base body only on the mounting surface.

In one embodiment of the present invention, at least one of the first and second external electrodes has a first main electrode portion extending along the mounting surface and a first auxiliary electrode portion extending along a first end surface of the base body that is connected to the mounting surface, and a distance between the first auxiliary electrode portion and the coil conductor is longer than a distance between the first lead-out conductor and the coil conductor.

In one embodiment of the present invention, the first lead-out conductor has an axial portion extending along the coil axis in the first region.

In one embodiment of the present invention, when seen in the direction of the coil axis, the axial portion of the first lead-out conductor is offset from a center between the first external electrode and the second external electrode to be closer to the first external electrode.

In one embodiment of the present invention, the first external electrode overlaps the first lead-out conductor when seen in the direction of the coil axis, and the first lead-out conductor is connected at the axial portion thereof to the first external electrode.

In one embodiment of the present invention, the first lead-out conductor has a first connecting portion and a second connecting portion, the first connecting portion connects one end of the axial portion and the first end of the coil conductor, the second connecting portion connects the other end of the axial portion and the first external electrode, and the other end of the axial portion is closer to the mounting surface than the one end is, and the first connecting portion overlaps the second connecting portion when seen in the direction of the coil axis.

One embodiment of the present invention relates to a circuit board comprising any one of the above coil components.

One embodiment of the present invention relates to an electronic device comprising the above circuit board.

Advantageous Effects

The present invention provides a novel coil component capable of achieving reduced magnetic saturation.

DESCRIPTION OF THE EMBODIMENTS

The following describes various embodiments of the present invention by referring to the appended drawings as appropriate. The constituents common to more than one drawing are denoted by the same reference signs throughout the drawings. It should be noted that the drawings do not necessarily appear to an accurate scale for the sake of convenience of explanation.

Figure 1:
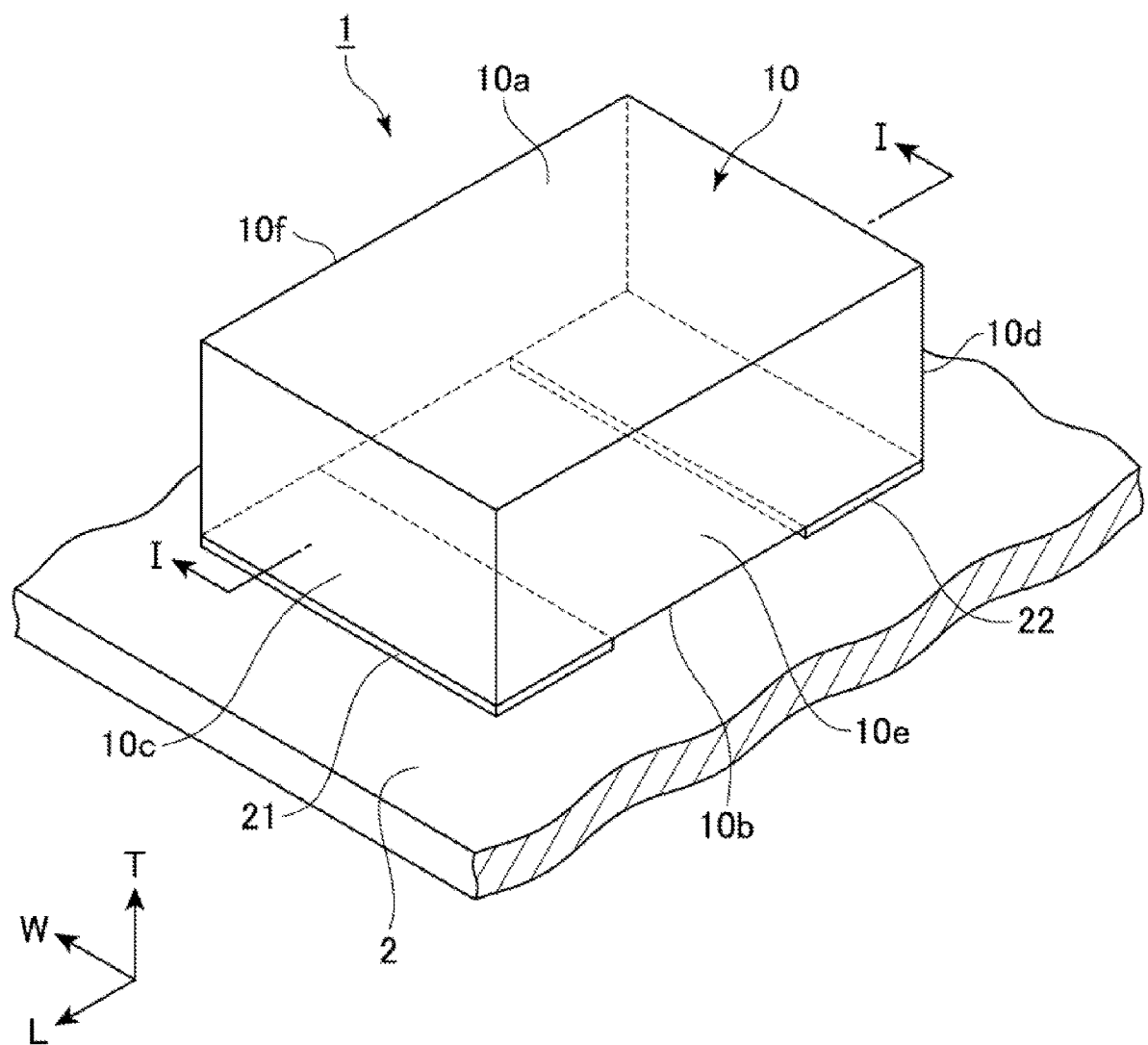
FIG. 1 is a perspective view of a coil component according to one embodiment of the present invention.
Figure 2:
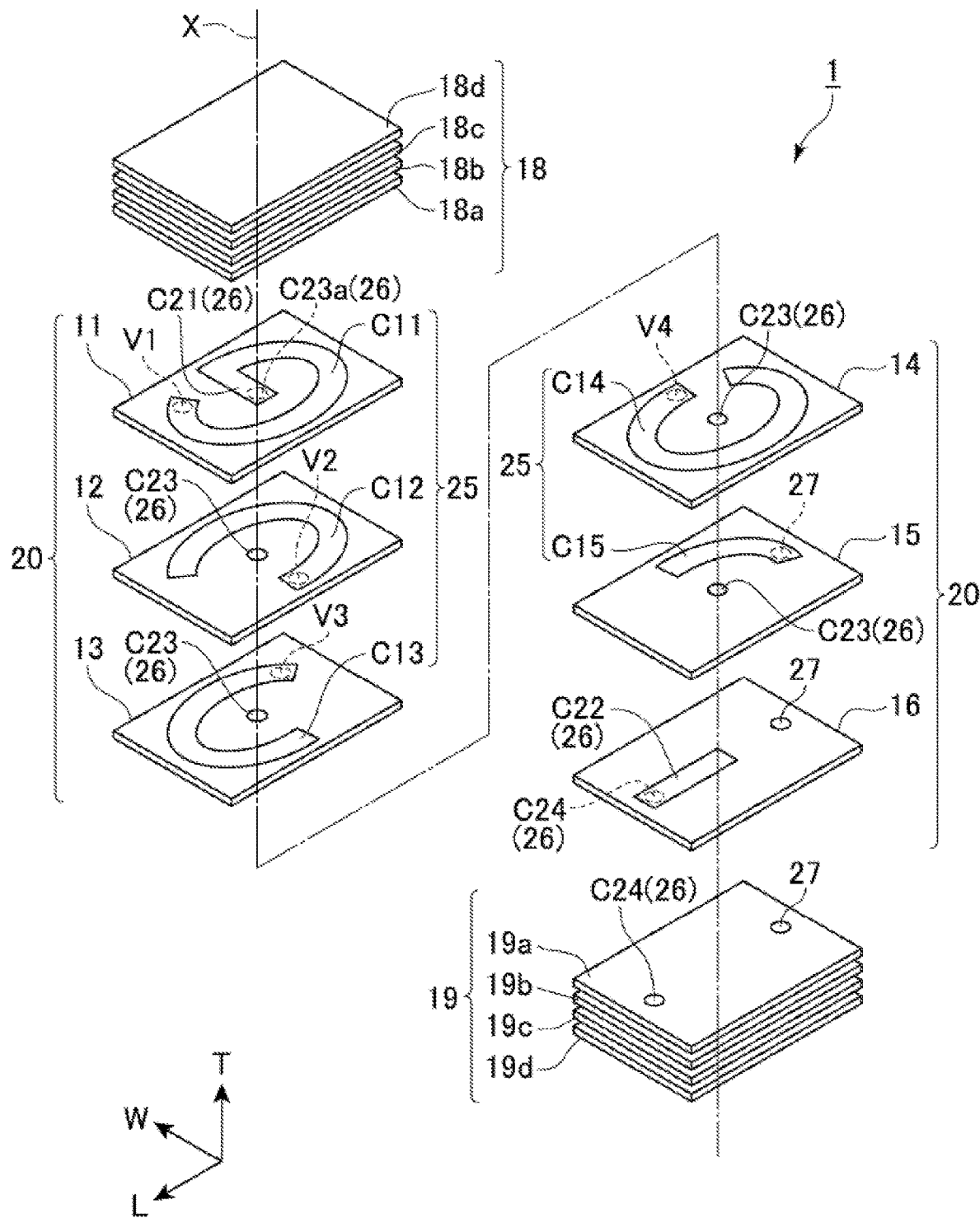
FIG. 2 is an exploded perspective view of the coil component shown in FIG. 1.

A coil component 1 according to one embodiment of the invention will be hereinafter described with reference to FIGS. 1 to 4. FIG. 1 is a perspective view of the coil component 1 according to one embodiment of the present invention, FIG. 2 is an exploded perspective view of the coil component 1 shown in FIG. 1, and FIGS. 3A to 3F are plan views schematically showing the magnetic layers included in the coil component 1, and FIG. 4 is a cross-sectional view schematically showing the cross-section of the coil component 1 cut along the line I-I. These drawings show, as one example of the coil component 1, a laminated inductor used as a passive element in various circuits. The laminated inductor is one example of a laminated coil component to which the present invention is applicable. In FIG. 2, external electrodes are not shown for convenience of description.

The coil component 1 of the embodiment shown is mounted to a circuit board 2 via a land portion 3. The coil component 1 is, for example, an inductor used to eliminate noise in an electronic circuit. The coil component 1 may be a power inductor built in a power supply line or an inductor used in a signal line.

In the attached drawings, an L axis, a W axis, and a T axis orthogonal to one another are shown. In each axis, the positive side is identified by the arrow and the negative side is the opposite to the positive side. Herein, the orientation and arrangement of the constituent members of the coil component 1 may be described based on the L axis, the W axis, and the T axis shown in FIGS. 1 and 2. Specifically, the T axis extends in the direction in which a coil axis X of a coil conductor 25 (described below) extends, and the L axis extends in the direction perpendicular to the coil axis X and parallel to the mounting surface of the circuit board 2. The W axis extends in the direction orthogonal to the T and L axes. Herein, the direction along the L axis may be referred to as a length direction of the coil component 1, the direction along the W axis may be referred to as a width direction of the coil component 1, and the direction along the T axis may be referred to as a height direction of the coil component 1. In addition, the expression "planar direction" may be used to refer to the direction in which the plane including the W and L axis directions extends.

The coil component 1 relating to the illustrated embodiment includes a base body 10, a coil conductor 25 provided within the base body 10, an external electrode 21, an external electrode 22, a lead-out conductor 26 electrically connecting one end of the coil conductor 25 and the external electrode 21, and a lead-out conductor 27 electrically connecting the other end of the coil conductor 25 and the external electrode 22.

The base body 10 is made of a magnetic material and formed in a rectangular parallelepiped shape. The base body 10 includes a coil layer 20 having a coil 25 embedded therein, a top-side cover layer 18 provided on the top-side surface of the coil layer 20 and a bottom-side cover layer 19 provided on the bottom-side surface of the coil layer 20. The boundary between the coil layer 20 and the top-side cover layer 18 and the boundary between the coil layer 20 and the bottom-side cover layer 19 may not be clearly seen depending on the manufacturing process of the base body 10. In the illustrated embodiment, the coil layer 20 includes magnetic layers 11 to 16, the top-side cover layer 18 includes magnetic layers 18a to 18d made of a magnetic material, and the bottom-side cover layer 19 includes magnetic layers 19a to 19d made of a magnetic material. The magnetic layer 16 may constitute a part of the bottom-side cover layer 19, instead of a part of the coil layer 20.

In one embodiment of the invention, the magnetic base body 10 is formed by combining together a plurality of soft magnetic metal particles having an oxide film formed on their surface. Adjacent ones of the soft magnetic metal particles are bonded to each other via each other's oxide film. Alternatively, adjacent ones of the soft magnetic metal particles may be directly bonded without the oxide film therebetween. There may be voids between the soft magnetic metal particles. Some or all of the voids may be filled with a resin. In one embodiment of the present invention, the resin contained in the magnetic base body 10 is, for example, a highly insulating thermosetting resin. Examples of the thermosetting resin used to form the magnetic base body 10 may include benzocyclobutene (BCB), an epoxy resin, a phenolic resin, an unsaturated polyester resin, a vinyl ester resin, a polyimide resin (PI), a polyphenylene ether oxide resin (PPO), a bismaleimide-triazine cyanate ester resin, a fumarate resin, a polybutadiene resin, and a polyvinyl benzyl ether resin. The base body 10 may have two or more regions made of different magnetic materials. For example, the coil layer 20 and the top-side cover layer 18 may be formed of different magnetic materials from each other.

As shown in the figures, in one embodiment of the present invention, the base body 10 is formed in a substantially rectangular parallelepiped shape. The base body 10 has a first principal surface 10a, a second principal surface 10b, a first end surface 10c, a second end surface 10d, a first side surface 10e, and a second side surface 10f. The outer surface of the base body 10 is defined by these six surfaces. The first principal surface 10a and the second principal surface 10b are opposed to each other, the first end surface 10c and the second end surface 10d are opposed to each other, and the first side surface 10e and the second side surface 10f are opposed to each other. In a case where the base body 10 is formed in a rectangular parallelepiped shape, the first principal surface 10a and the second principal surface 10b are parallel to each other, the first end surface 10c and the second end surface 10d are parallel to each other, and the first side surface 10e and the second side surface 10f are parallel to each other. The first principal surface 10a, the second principal surface 10b, the first end surface 10c, the second end surface 10d, the first side surface 10e, the second side surface 10f of the base body 10 may be each a flat or curved surface. Furthermore, the eight corners of the base body 10 may be rounded. Even when the first principal surface 10a, the second principal surface 10b, the first end surface 10c, the second end surface 10d, the first side surface 10e, and the second side surface 10f of the base body 10 are partly curved or the corners of the base body 10 are rounded as mentioned above, the shape of the base body 10 may be herein referred to as a "rectangular parallelepiped shape." That is, a "rectangular parallelepiped" or a "rectangular parallelepiped shape" described herein is not intended to mean a "rectangular parallelepiped" in a mathematically strict sense.

In the embodiment of FIG. 1, the first principal surface 10a lies on a top side of the base body 10 and, therefore, may be referred to as "the top surface" in this specification. Similarly, the second principal surface 10b may be referred to as "the bottom surface." The coil component 1 is disposed such that the second principal surface 10b is opposed to a circuit board (not shown), and therefore, the second principal surface 10b may be herein referred to as "the mounting surface." Furthermore, the top-bottom direction of the coil component 1 is based on the top-bottom direction in FIG. 1.

In one embodiment of the present invention, the coil component 1 has a length (the dimension in the direction of the L axis) of 0.2 to 6.0 mm, a width (the dimension in the direction of the W axis) of 0.1 to 4.5 mm, and a thickness (the dimension in the direction of the T axis) of 0.1 to 4.0 mm. These dimensions are mere examples, and the coil component 1 to which the present invention can be applied can have any dimensions that conform to the purport of the present invention. In one embodiment, the coil component 1 has a low profile. For example, the coil component 1 has a width larger than the thickness thereof.

The coil conductor 25 is provided within the base body 10. In other words, the coil conductor is embedded in the base body 10. The external electrodes 21 and 22 are both provided on the mounting surface 10b of the base body 10. In the illustrated embodiment, the external electrodes 21 and 22 are both in contact with the base body 10 only on the mounting surface 10b and in contact with none of the first principal surface 10a, the first end surface 10c, the second end surface 10d, the first side surface 10e and the second side surface 10f. In other words, the external electrodes 21 and 22 are provided only on the mounting surface 10b. The external electrodes 21 and 22 are separated from each other in the length direction. Between the external electrode 21 and the external electrode 22, an insulator, which is not shown, may be provided. This insulator can reliably provide insulating property even when there is a small gap between the external electrode 21 and the external electrode 22.

Next, a further description is given of the laminated structure of the coil component 1 mainly with reference to FIG. 2. FIG. 2 is an exploded perspective view showing the coil component 1, which is fabricated by the laminating process. As shown in FIG. 2, the coil layer 20 includes the magnetic layers 11 to 16. In the coil layer 20, the magnetic layers 16, 15, 14, 13, 12 and 11 are stacked in the stated order in the T axis direction from the negative side to the positive side. The coil component 1 may be fabricated using various techniques other than the laminating process. For example, the coil component 1 may be alternatively fabricated to have the laminated structure using the thin film process.

On the respective top-side surfaces of the magnetic layers 11 to 15, conductor patterns C11 to C15 are formed. The conductor patterns C11 to C15 are formed by, for example, printing a conductive paste made of a highly conductive metal or alloy via screen printing. The conductive paste may be made of Ag, Pd, Cu, Al, or alloys thereof. The conductor patterns C11 to C15 may be formed using other methods and materials. For example, the conductor patterns C11 to C15 may be formed by sputtering, ink-jetting, or other known methods.

The magnetic layers 11 to 14 are provided with vias V1 to V4, respectively, at a predetermined position therein. The vias V1 to V4 are formed by forming a through-hole at the predetermined position in the magnetic layers 11 to 14 so as to extend through the magnetic layers 11 to 14 in the T axis direction and filling the through-holes with a conductive material.

Each of the conductor patterns C11 to C15 is electrically connected to the respective adjacent conductor patterns through the vias V1 to V4. The conductor patterns C11 to C15 connected in this manner form the spiral coil conductor 25. In other words, the coil conductor 25 is constituted by the conductor patterns C11 to C15 and the vias V1 to V4. As shown, the coil conductor 25 is wound to surround the coil axis X through the plurality of layers (magnetic layers 11 to 15). In other words, the coil conductor 25 extends to surround the coil axis X as shown in FIGS. 3A to 3E when seen in the coil axis X direction and extends in the top-bottom direction as shown in FIG. 4 when seen in the cross-section including the coil axis X.

The base body 10 is divided into a first region R1 and a second region R2. The first region R1 may refer to the region inside the coil conductor 25 (i.e., the conductor patterns C11 to C15) in the planar direction or the radial direction with respect to the coil axis X when seen in the direction of the coil axis X. In other words, the first region R1 may refer to the region, in the base body 10, inside a radially inner surface 25d of the coil conductor 25. The second region R2 may refer to the region outside the coil conductor 25 (i.e., the conductor patterns C11 to C15) in the planar direction or the radial direction with respect to the coil axis X when seen in the direction of the coil axis X. In other words, the second region R2 may refer to the region, in the base body 10, outside a radially outer surface 25c of the coil conductor 25. If the conductor patterns C11 to C15 are in the same trajectory around the coil axis X and have an equal width with each other when seen in the direction of the coil axis X, the first region R1 has the same shape and area in each of the magnetic layers 11 to 15, which respectively include the conductor patterns C11 to C15. In the illustrated embodiment, the conductor patterns C11 to C15 are in the same trajectory around the coil axis X. If the conductor patterns C11 to C15 are in different trajectories, the respective shapes of the conductor patterns C11 to C15 are projected onto a plane perpendicular to the coil axis X, the radially innermost portion is selected from among the respective inner surfaces 25d of the conductor patterns C11 to C15 projected onto the plane in a given angle around the coil axis, the thus selected portions are connected together to entirely encircle the coil axis X to form a composite inner surface, and the region inside the composite inner surface may be referred to as the first region R1. When the conductor patterns C11 to C15 are in different trajectories, the second region R2 may be defined by a composite outer surface that is formed in the same manner as described above. Specifically, the respective shapes of the conductor patterns C11 to C15 are projected onto a plane perpendicular to the coil axis X, the radially outermost portion is selected from among the respective outer surfaces 25d of the conductor patterns C11 to C15 projected onto the plane in a given angle around the coil axis, the thus selected portions are connected together to entirely encircle the coil axis X to form a composite outer surface, and the region radially outside the composite outer surface may be referred to as the second region R2. In FIG. 4, the alternate long and short dash line indicating the boundary of the first region R1 and the alternate long and short dash line indicating the boundary of the second region R2 run slightly inside the surface of the base body 10 for the sake of intelligibility of the lines. The boundaries of the first and second regions R1 and R2 may be aligned with the surface of the base body 10. The boundaries of the first and second regions R1 and R2 may be in contact with the coil conductor 25.

In one embodiment, the coil conductor 25 is configured and arranged such that the ratio in area of the first region R1 to the second region R2 is within the range from 0.6 to 1.0. The coil conductor 25 may be configured such that the ratio in area of the first region R1 to the second region R2 is within the range of from 0.7 to 0.9, from 0.75 to 0.85, from 0.76 to 0.84, from 0.77 to 0.83, from 0.78 to 0.82, or from 0.79 to 0.81. In the second region R2, the magnetic fluxes are unlikely to pass through the region in the vicinity of the corners when seen in the direction of the coil axis X. According to the researches made by the present inventors, if the ration in area of the first region R1 to the second region R2 is around 0.8, the magnetic fluxes are unlikely to concentrate in a specific region, and magnetic saturation is accordingly unlikely to occur. If the ratio in area of the first region R1 to the second region R2 is lower than 0.6, the area of the first region R1 is too small, which is likely to cause magnetic flux concentration in the first region R1. On the other hand, if the ratio in area of the first region R1 to the second region R2 is higher than 1.0, the magnetic fluxes are likely to concentrate in the second region R2. In one embodiment of the present invention, the magnetic fluxes can be prevented from concentrating by setting the ratio in area of the first region R1 to the second region R2 within the range from 0.6 to 1.0.

The coil conductor 25 is electrically connected to the external electrode 21 via the lead-out conductor 26 and electrically connected to the external electrode 22 via the lead-out conductor 27. As shown, one end 25a of the coil conductor 25 is positioned above the other end 25b. Herein, the one end 25a of the coil conductor 25 may be referred to as the first end 25a, and the other end 25b may be referred to as the second end 25b. The one end 25a of the coil conductor 25 corresponds to the end of the conductor pattern C11 that is opposite to the end connected to the via V1. The other end 25b of the coil conductor 25 corresponds to the end of the conductor pattern C15 that is opposite to the end connected to the via V4. Thus, the one end 25a of the coil conductor 25 is on the magnetic layer 11, and the other end 25b of the coil conductor 25 is on the magnetic layer 15. This means that the one end 25a of the coil conductor 25 is more distant from the mounting surface 10b and from the external electrodes 21 and 22 provided on the mounting surface 10b than the other end 25b is. In other words, the other end 25b of the coil conductor 25 is closer to the mounting surface 10b and to the external electrodes 21 and 22 provided on the mounting surface 10b than the one end 25a is.

The lead-out conductor 26 extends between the one end 25a of the coil conductor 25 and the external electrode 21. In the illustrated embodiment, the lead-out conductor 26 has an axial portion C23 extending along the coil axis X, a planar lead-out portion C21 connecting the top-side end C23a of the axial portion C23 and the one end 25a of the coil conductor 25, a via C24 extending upward along the coil axis X from the external electrode 21, and a planar lead-out portion C22 connecting the bottom-side end C23b of the axial portion C23 and the top-side end of the via C24.

The axial portion C23 may be provided as a via in the base body 10. In the illustrated embodiment, a through hole is provided in the magnetic layers 11 to 15 and filled with a conductive material, so that the axial portion C23 is formed. The top-side end C23a of the axial portion C23 is more distant from the external electrodes 21 and 22 than the bottom-side end C23b of the axial portion C23 is.

Figure 3A:
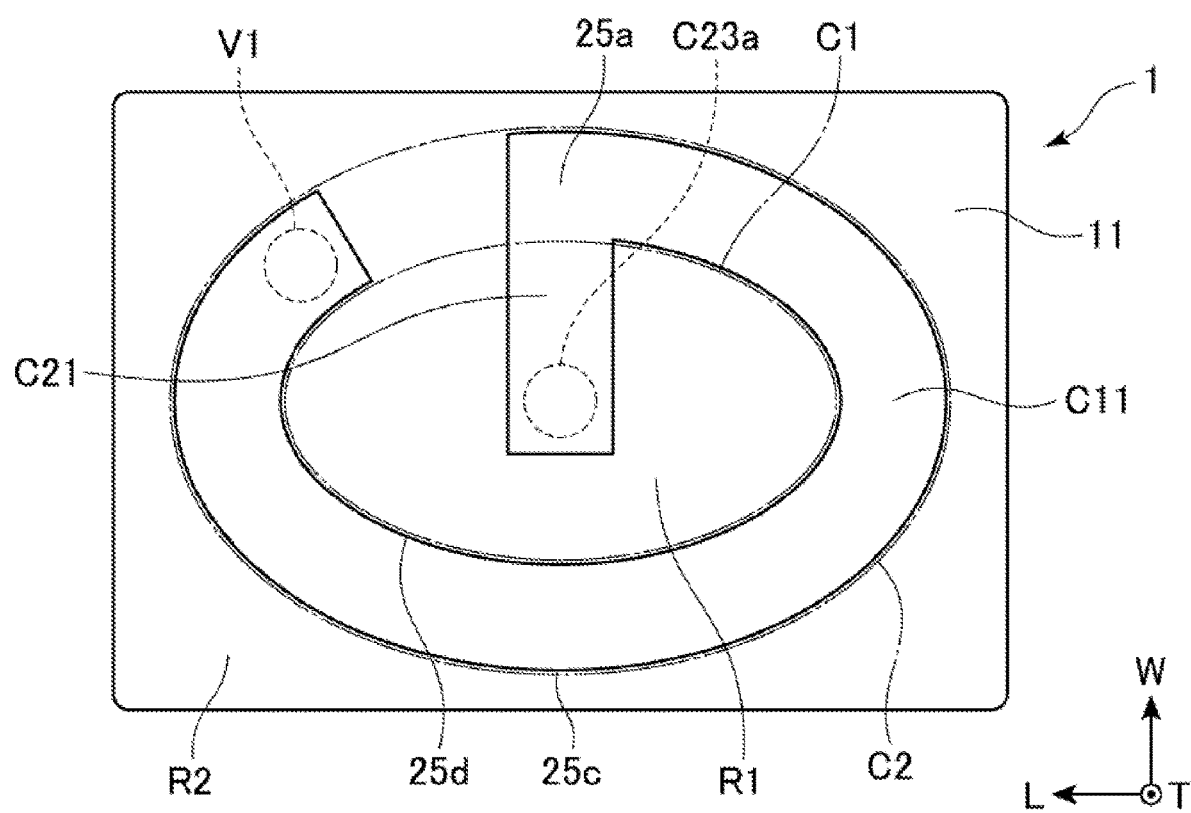
FIG. 3A is a plan view schematically showing a magnetic layer included in the coil component shown in FIG. 1.
Figure 3B:
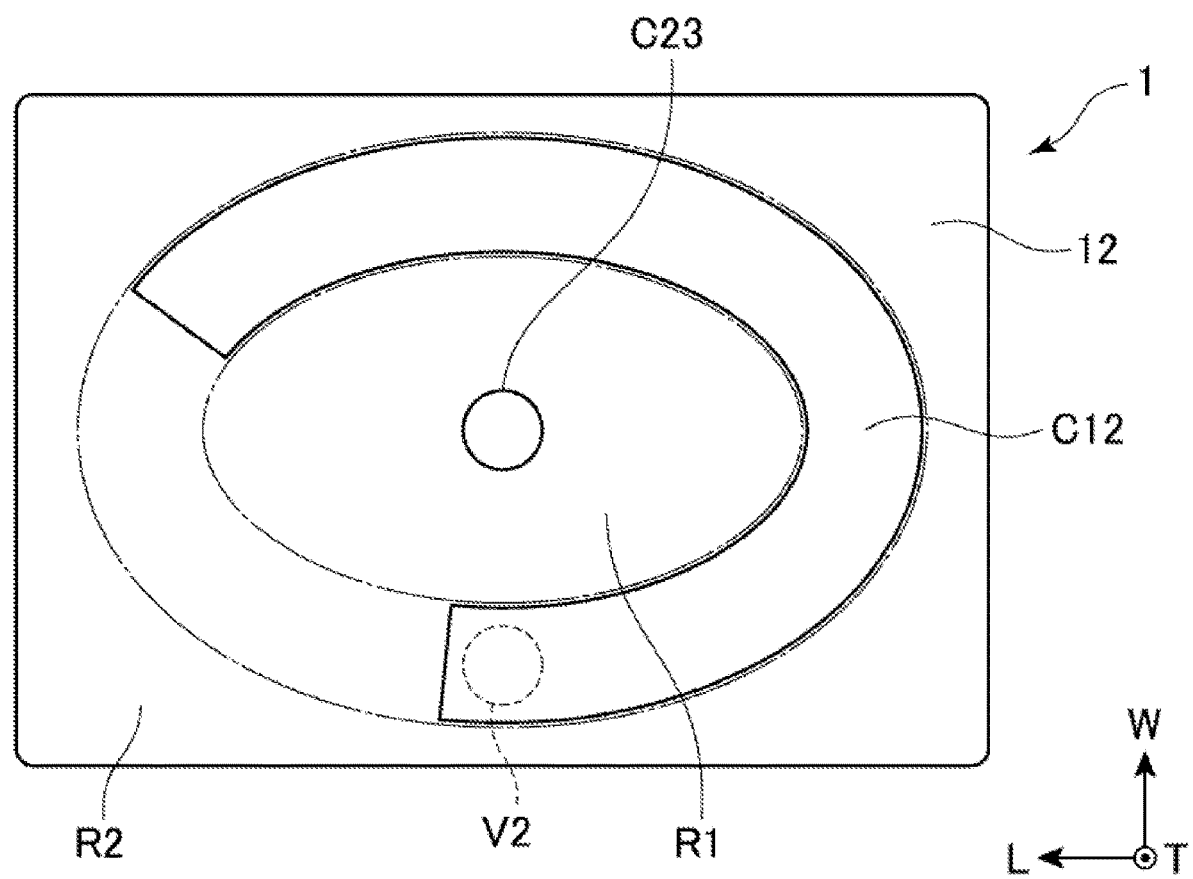
FIG. 3B is a plan view schematically showing a magnetic layer included in the coil component shown in FIG. 1.
Figure 3C:
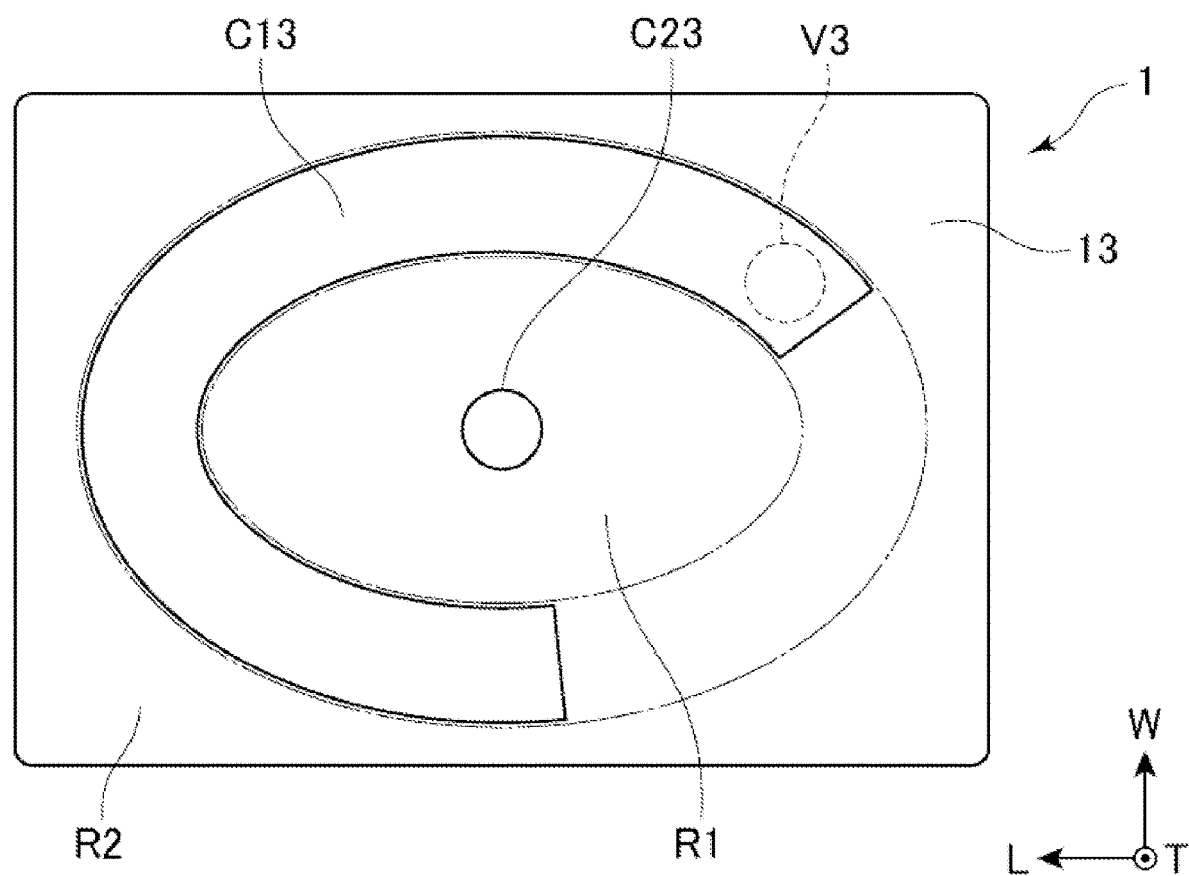
FIG. 3C is a plan view schematically showing a magnetic layer included in the coil component shown in FIG. 1.
Figure 3D:
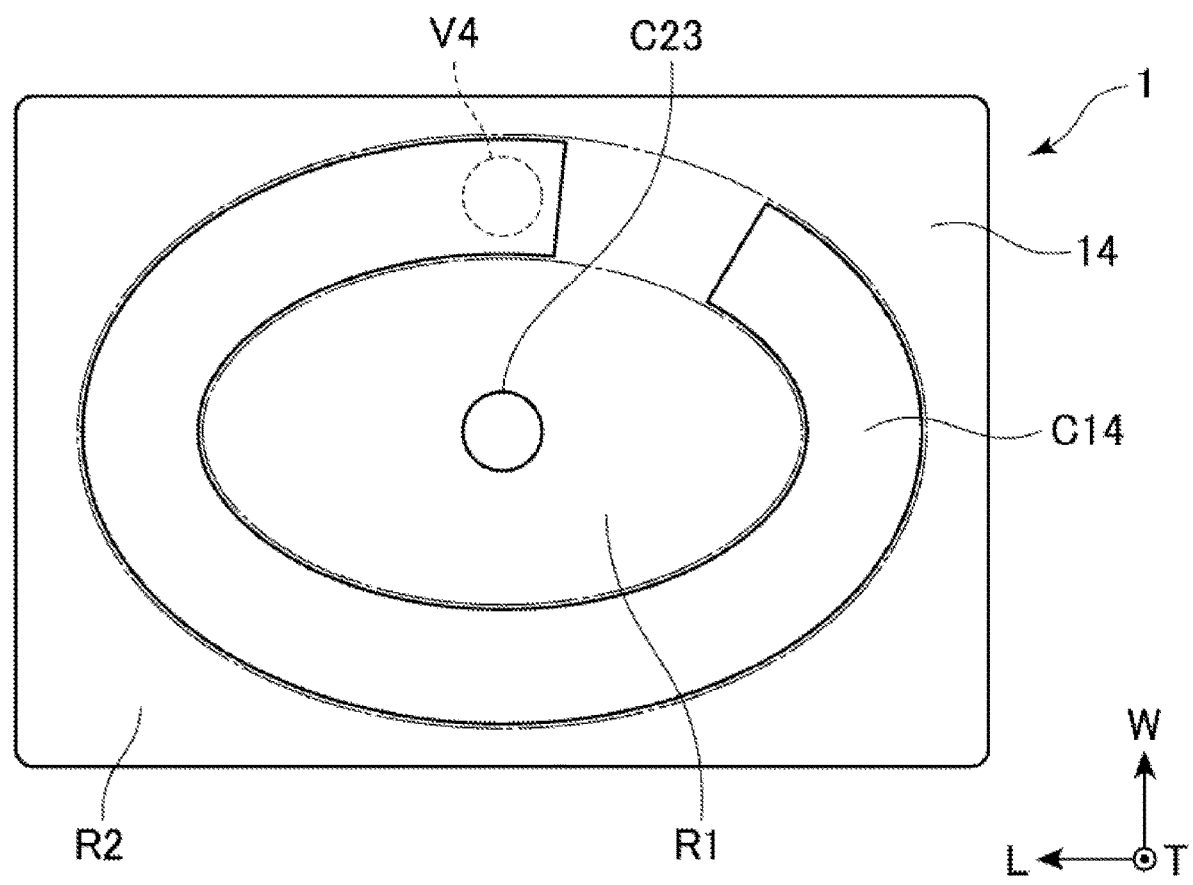
FIG. 3D is a plan view schematically showing a magnetic layer included in the coil component shown in FIG. 1.
Figure 3E:
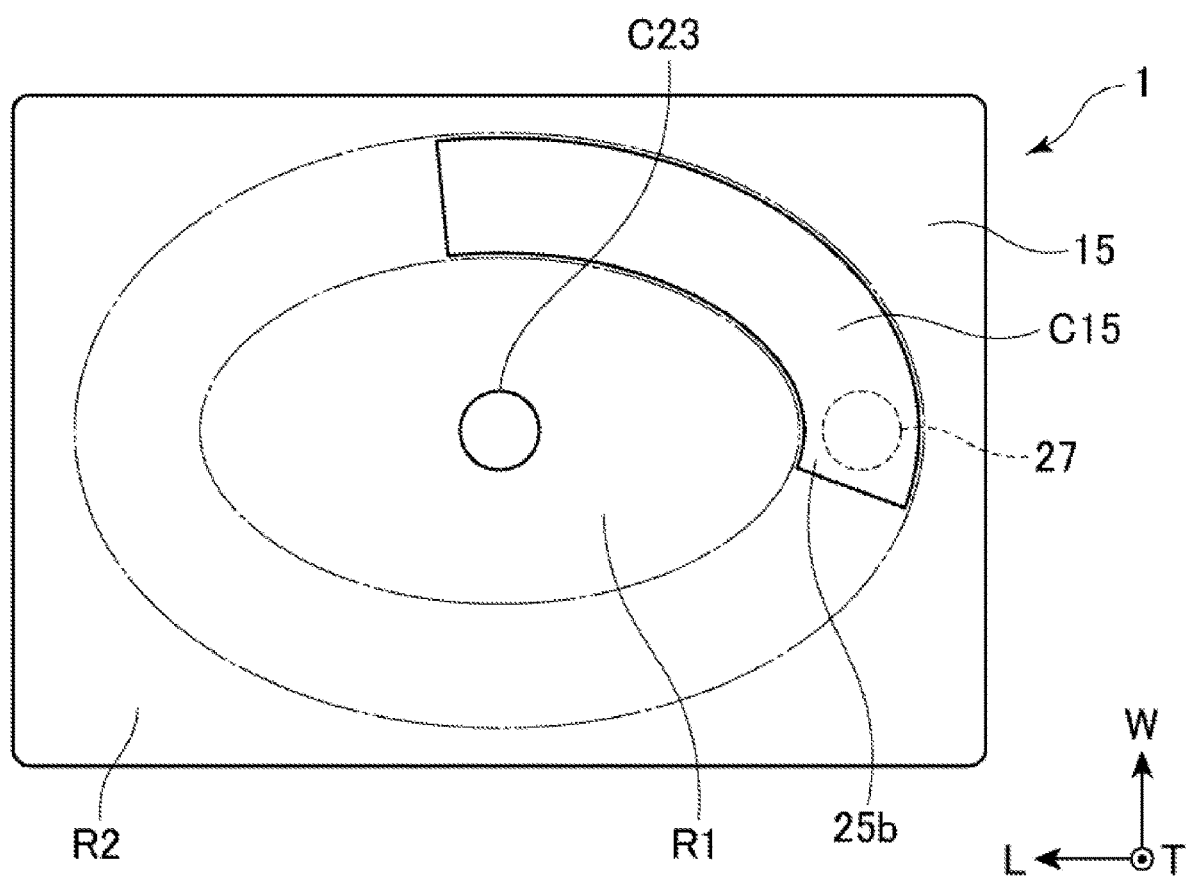
FIG. 3E is a plan view schematically showing a magnetic layer included in the coil component shown in FIG. 1.
Figure 3F:
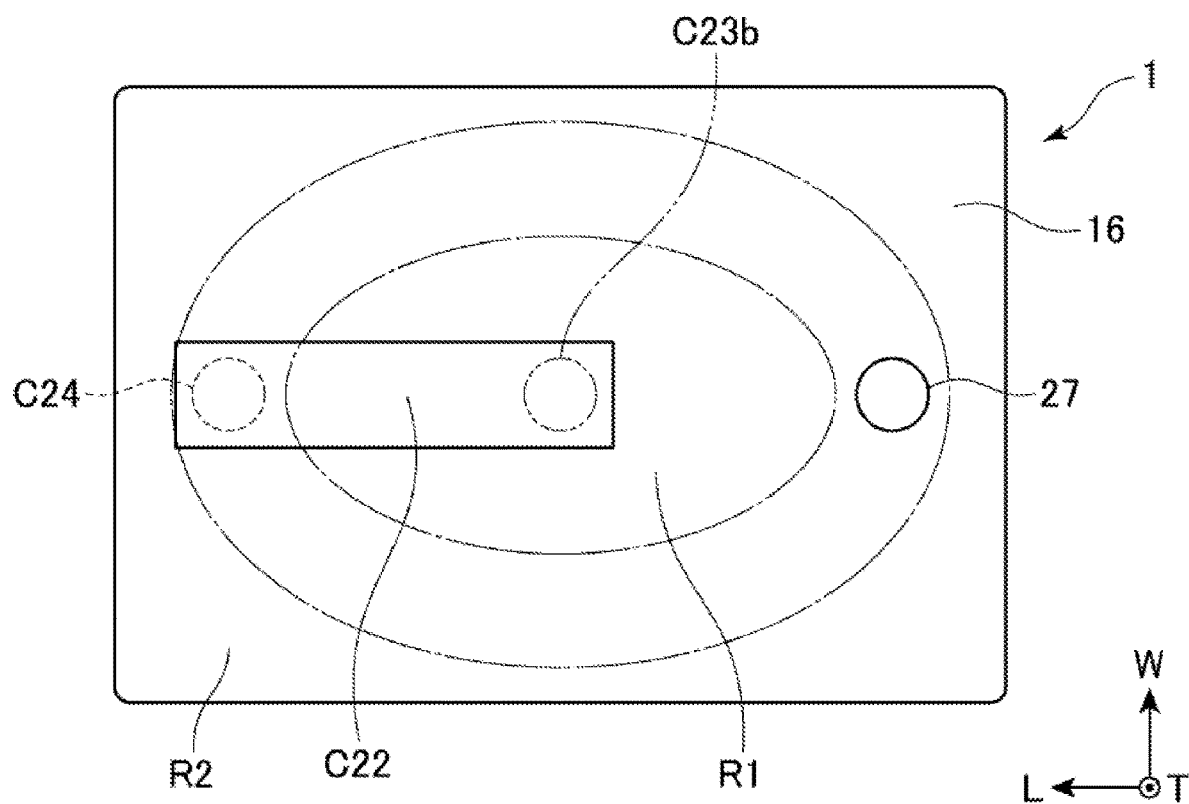
FIG. 3F is a plan view schematically showing a magnetic layer included in the coil component shown in FIG. 1.
Figure 3G:
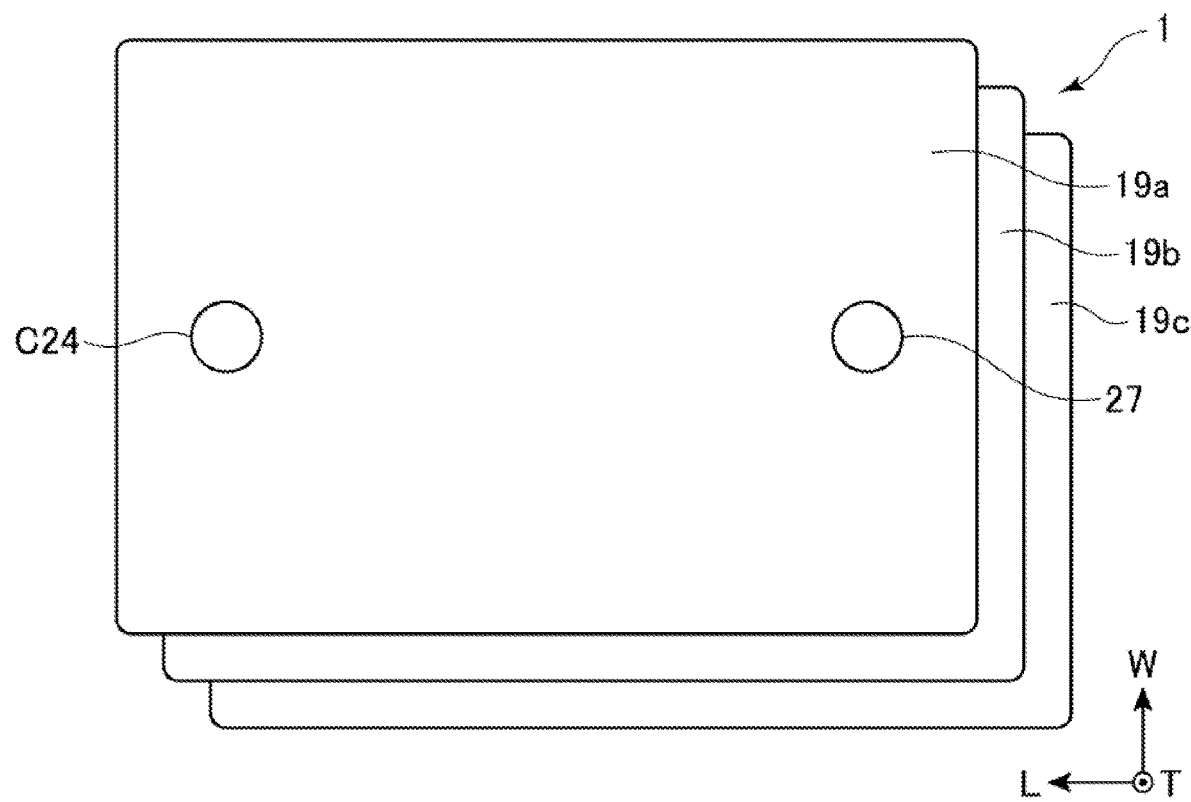
FIG. 3G is a plan view schematically showing a magnetic layer included in the coil component shown in FIG. 1.
Figure 3H:
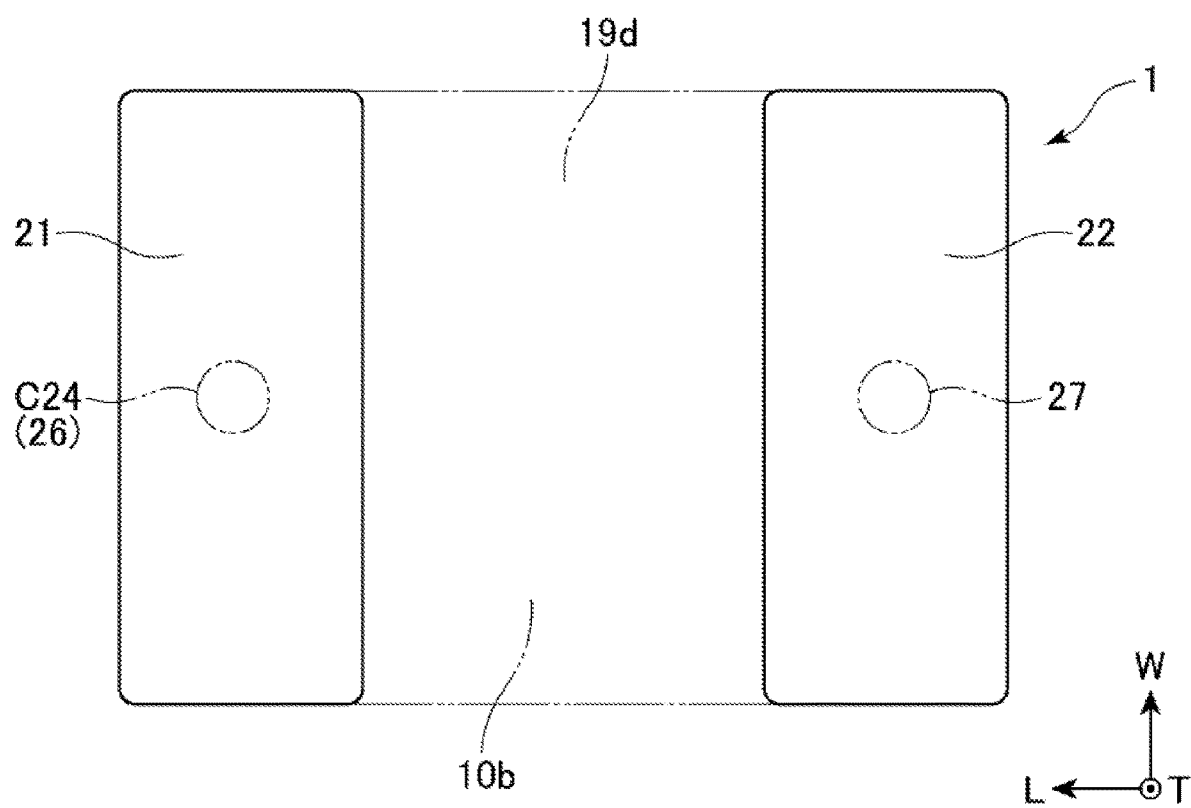
FIG. 3H is a plan view schematically showing a magnetic layer included in the coil component shown in FIG. 1.
Figure 4:
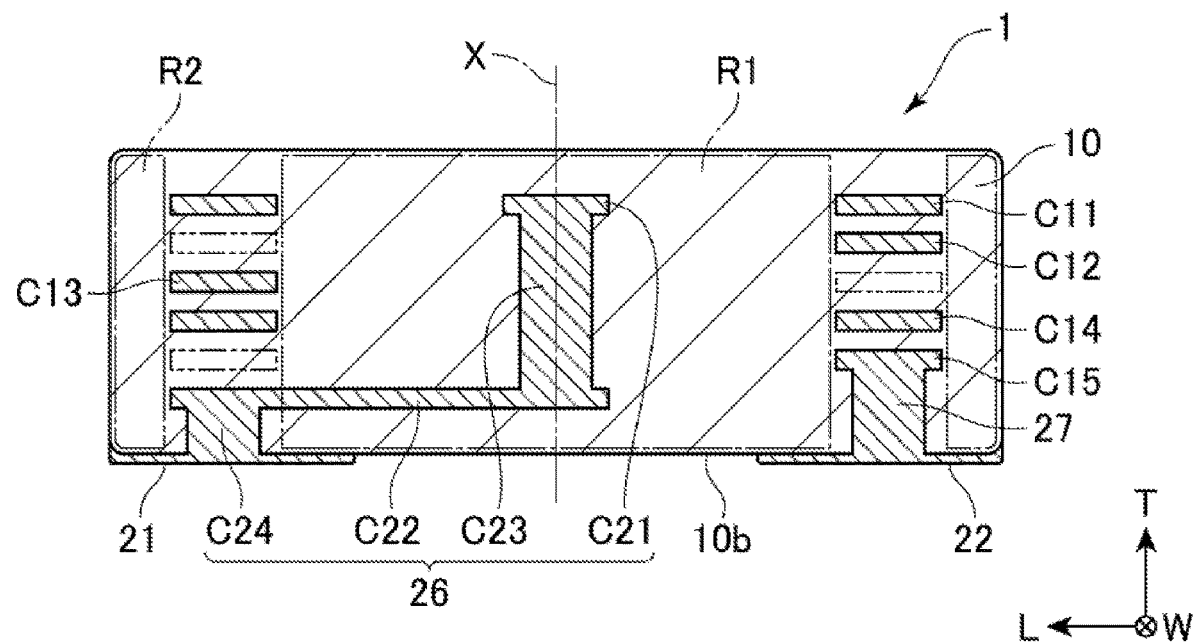
FIG. 4 is a cross-sectional view schematically showing the cross-section of the coil component along the I-I line of FIG. 1.

As shown in FIG. 3A, the planar lead-out portion C21 is on the top-side surface of the magnetic layer 11. As shown in FIG. 3F, the planar lead-out portion C22 is on the top-side surface of the magnetic layer 16. The planar lead-out portions C21, C22 can be formed of a conductive material using various known techniques, like the conductor patterns C11 to C15.

The via C24 is formed by providing a through hole in the magnetic layers 16 and 19a to 19d and filling the through hole with a conductive material. The via C24 extends along the coil axis X from the radially outer end of the planar lead-out portion C22 to the external electrode 21.

The lead-out conductor 27 extends between the other end 25b of the coil conductor 26 and the external electrode 22. The lead-out conductor 27 may be provided as a via in the base body 10. In the illustrated embodiment, a through hole is provided in the magnetic layers 15, 16 and 19a to 19d and filled with a conductive material, so that the lead-out conductor 27 is formed. The lead-out conductor 27 extends along the coil axis X from the other end 25b of the coil conductor 25 to the external electrode 22. In one embodiment, when seen in the direction of the coil axis X, the lead-out conductor 27 is positioned not to overlap the second region R2.

As shown, at least a portion of the lead-out conductor 26 is positioned within the first region R1 when seen in the direction of the coil axis X. In the illustrated embodiment, the planar lead-out portion C21 is entirely positioned within the first region R1, the axial portion C23 is entirely positioned within the first region R1 and the planar lead-out portion C22 is partially positioned within the first region R1. In one embodiment, the axial portion C23 is entirely positioned within the first region R1. In one embodiment, the lead-out conductor 26 is entirely positioned inside the second region R2 in the radial direction so as not to overlap the second region R2. In the illustrated embodiment, a portion of the planar lead-out portion C22 (the radially outer end) and the via C24 are positioned outside the first region R1 in the radial direction but still inside the second region R2 in the radial direction.

Next, a description is given of an example of a method of manufacturing the coil component 1. The coil component 1 can be manufactured by, for example, a laminating process. The following describes, as an example, the method of manufacturing the coil component 1 using the laminating process.

To begin with, sheets of a magnetic material are formed, which are to be used as the magnetic layers 18a to 18d constituting the top-side cover layer 18, the magnetic layers 11 to 16 constituting the coil layer 20, and the magnetic layers 19a to 19d constituting the bottom-side cover layer 19. These sheets of a magnetic material are made of a composite magnetic material containing a binder and a plurality of metal magnetic particles.

In order to manufacture the sheets of the magnetic material, the metal magnetic particles are first prepared. The metal magnetic particles for the sheets of the magnetic material are of a crystalline or amorphous metal or alloy containing at least one element selected from the group consisting of iron (Fe), nickel (Ni) and cobalt (Co). The metal magnetic particles may further contain at least one element selected from the group consisting of silicon (Si), chromium (Cr) and aluminum (Al). The metal magnetic particles may be pure iron particles containing Fe and unavoidable impurities, or particles of an Fe-based amorphous alloy containing iron (Fe). The metal magnetic particles may be carbonyl iron powders with an Fe content of 99.9 wt % or more.

In one embodiment, the average particle size of the metal magnetic particles is from 1 μm to 200 μm. These metal magnetic particles may include two or more types of metal magnetic particles having different average particle sizes from each other. For example, the metal magnetic particles for the composite magnetic material may include first metal magnetic particles having a first average particle size and second metal magnetic particles having a second average particle size smaller than the first average particle size. In one embodiment, the average particle size of the second metal magnetic particles is $\frac{1}{10}$ or less of the average particle size of the first metal magnetic particles. When the average particle size of the second metal magnetic particles is $\frac{1}{10}$ or less of the average particle size of the first metal magnetic particles, the second metal magnetic particles can easily enter the gap between adjacent first metal magnetic particles 31, which can resultantly increase the density of the metal magnetic particles in the base body 10.

An insulating film is provided on the surface of the metal magnetic particles in order to prevent the short circuits between the metal magnetic particles. The insulating film is preferably formed to cover the whole surface of the metal magnetic particle. As described above, when the metal magnetic particles contain three types of metal magnetic particles having different average particle sizes, an insulating film is preferably formed on the powders having an average particle size of 1 μm or more, and no insulating film may be formed on the metal magnetic particles having an average particle size smaller than 1 μm or third metal magnetic particles having the smallest average particle size. This is because the short circuits between metal magnetic particles having a sufficiently small average particle size and other metal magnetic particles have only a minor influence on eddy current loss.

Subsequently, a group of metal magnetic particles having an insulating film formed thereon as described above and a binder are mixed and kneaded together to make a slurry. The slurry is then applied to a surface of a plastic base film using the doctor blade technique or any other common methods and dried, and the dried slurry is cut to a predetermined size, so that a sheet material is obtained.

After this, a coil conductor is provided in the sheets of the magnetic material manufactured in the above manner. Specifically, a through-hole is formed in the respective sheets of the magnetic material, which are to be used as the magnetic layers 11 to 16 and the magnetic layers 19a to 19d, at a predetermined position so as to extend through the sheets in the direction of the T axis. Following this, a conductive paste is printed by screen printing on the top-side surface of each of the sheets of the magnetic material, which are to be used as the magnetic layers 11 to 16, so that unfired conductor patterns and planar lead-out portions are formed on the sheets of the magnetic material. Also, the through-hole formed in each sheet of the magnetic material is filled with the conductive paste. The conductor patterns formed in the above manner on the sheets of the magnetic material are formed into the conductor patterns C11 to C15, the planar lead-out portion C21, and the planar lead-out portion C22 by firing, and the metal placed in the through hole is formed into the vias V1 to V4, the axial portion C23 and the via C24. The conductor patterns can be formed by any various known methods instead of the screen printing.

Next, the sheets of the magnetic material, which are to be used as the magnetic layers 11 to 16, are stacked to obtain a coil laminated body. The sheets of the magnetic material, which are to be used as the magnetic layers 11 to 16, are stacked such that the conductor patterns C11 to C15 formed on the respective sheets of the magnetic material are each electrically connected to the adjacent conductor patterns through the vias V1 to V4.

Following this, a plurality of sheets of a magnetic material are stacked to form a top-side laminated body, which is to be used as the top-side cover layer 18. Similarly, a plurality of sheets of a magnetic material are stacked to form a bottom-side laminated body, which is to be used as the bottom-side cover layer 19.

Next, the bottom-side laminated body, the coil laminated body, and the top-side laminated body are stacked in the stated order in the direction of the T axis from the negative side to the positive side, and these stacked laminated bodies are bonded together by thermal compression using a pressing machine to produce a main laminated body. Instead of forming the bottom-side, coil and top-side laminated bodies, the main laminated body may be formed by sequentially stacking all of the sheets of the magnetic material prepared in advance and bonding the stacked sheets of the magnetic material collectively by thermal compression. Next, the main laminated body is diced in a desired size using a cutter such as a dicing machine or a laser processing machine to obtain individual chip laminated bodies. Polishing treatment such as barrel polishing may be performed on the end portions of the chip laminated body, if necessary.

Next, the chip laminated body is degreased and then subjected to thermal treatment, so that the base body 10 is obtained. Next, a conductive paste is applied to the bottom-side surface (mounting surface) of the chip laminated body to form the external electrodes 21 and 22. At least one of a solder barrier layer and a solder wetting layer may be formed on the external electrode 21 and the external electrode 22 as necessary. Thus, the coil component 1 is obtained.

Some of the steps included in the above manufacturing method may be skipped as necessary. In the manufacturing method of the inductor 1, steps not described explicitly in this specification may be performed as necessary. Some of the steps included in the above-described manufacturing method of the inductor 1 may be performed in different orders within the purposes of the present invention. Some of the steps included in the above-described manufacturing method of the inductor 1 may be performed at the same time or in parallel, if possible.

Figure 5A:
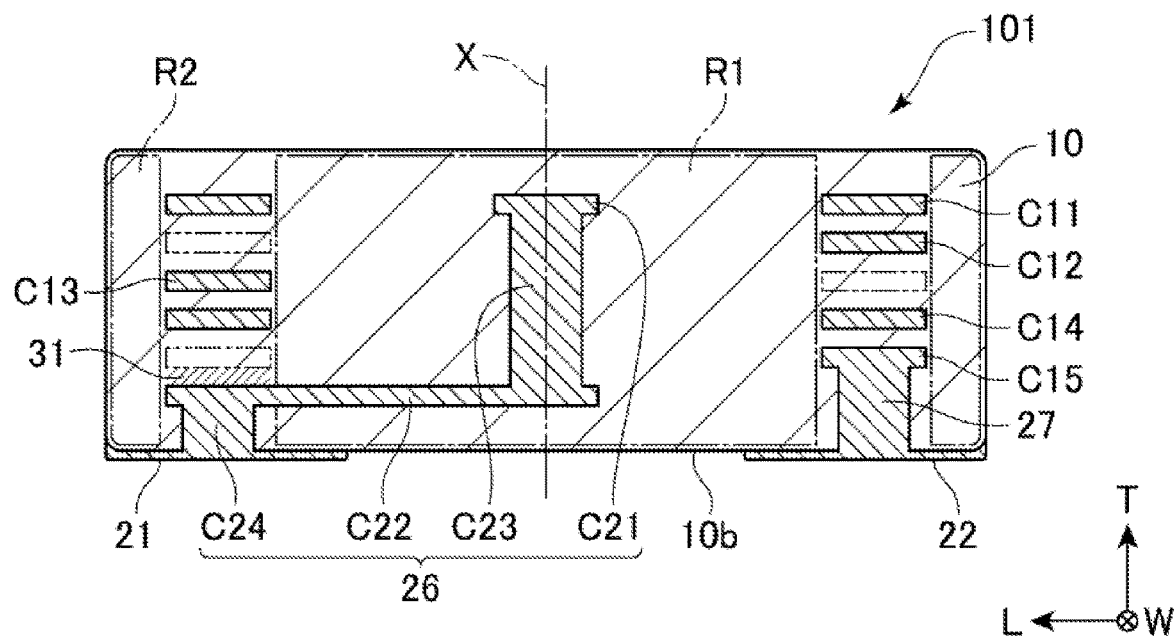
FIG. 5A is a cross-sectional view schematically showing the cross-section of a coil component relating to another embodiment of the present invention along the coil axis.
Figure 5B:
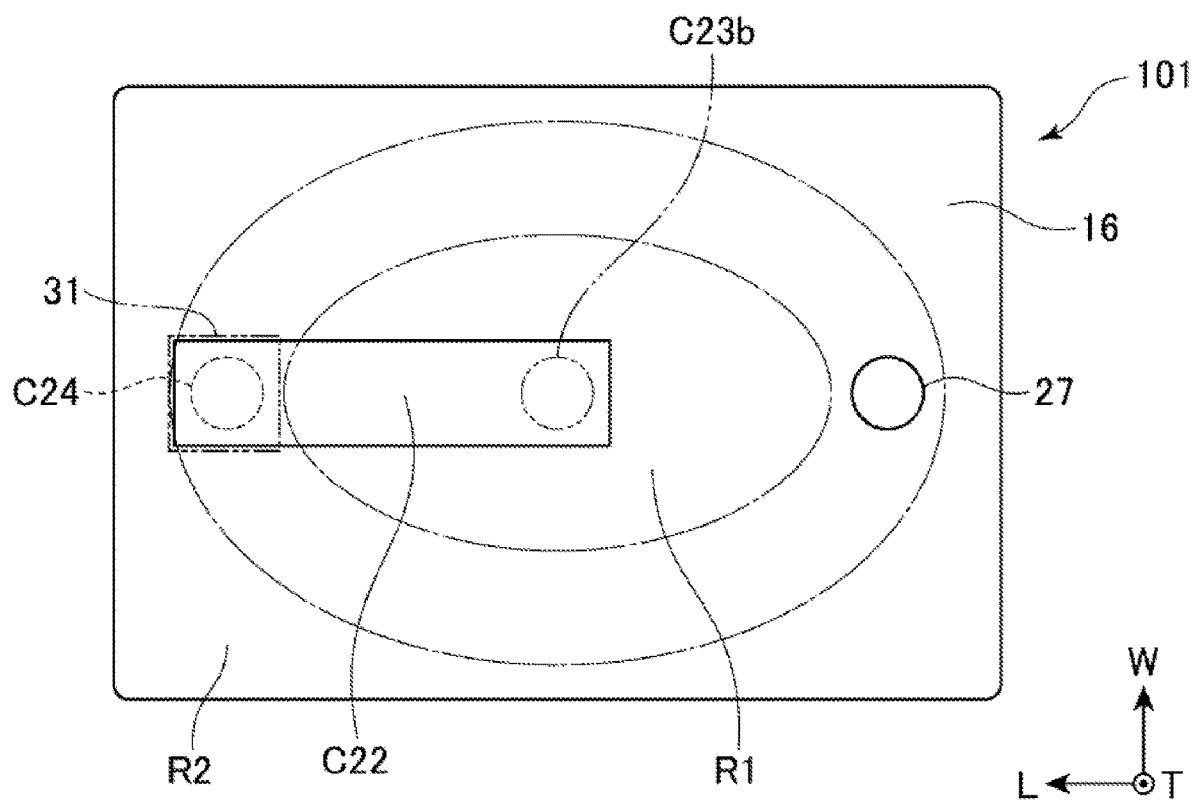
FIG. 5B schematically shows how an insulator 31 is arranged in a coil component relating to another embodiment of the present invention.

Next, a coil component 101 according to another embodiment of the present invention will be described with reference to FIGS. 5A and 5B. The coil component 101 shown in FIGS. 5A and 5B is different from the coil component 1 in that the coil component 101 additionally has an insulator 31. As shown in FIG. 5A, the insulator 31 covers a part of the top-side surface of the planar lead-out portion C22. As shown in FIG. 5B, the insulator 31 relating to one embodiment is provided so as to cover the overlap region in which the lead-out conductor 26 overlaps the coil conductor 25, and the overlap region is positioned between the coil conductor 25 and the lead-out conductor 26, when seen in the direction of the coil axis X.

The insulator 31 has higher insulating property than the other region in the base body 10 (for example, the magnetic layers 11 to 16, the magnetic layers 18a to 18d, and magnetic layers 19a to 19d). The insulator 31 can be made of, for example, glass, glass added with a filler, a metal magnetic material containing Fe having an oxide film resulting from thermal oxidization, or the like. Alternatively, the insulator 31 may be made of a mixture of the listed materials. The volume resistivity of the material forming the insulator 31 is higher than that of the other region in the base body 10 by 100 Ω·cm or more, for example.

In the coil component 1, while the via C24 is connected to the external electrode 21, the conductor pattern C15 is electrically the closest to the external electrode 22 among the conductor patterns C11 to C15. Accordingly, high voltage is applied to the region between the via C24 and the conductor pattern C15. Therefore, high voltage is exhibited between the conductors in the overlap region in which the lead-out conductor 26 and the coil conductor 25 overlap each other when seen in the direction of the coil axis X. Since the insulator 31 is arranged to cover this overlap region, the insulator 31 can effectively reduce dielectric breakdown in the base body 10.

Figure 6:
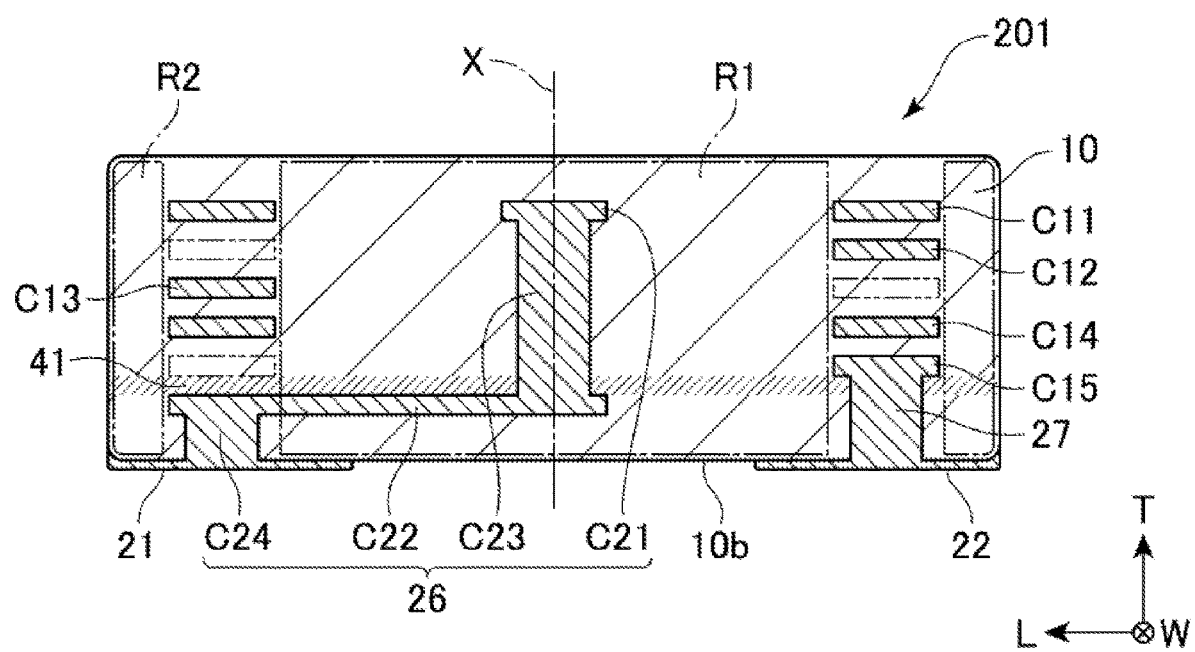
FIG. 6 is a cross-sectional view schematically showing the cross-section of a coil component relating to another embodiment of the present invention along the coil axis.

Next, with reference to FIG. 6, a description is given of a coil component 201 according to still another embodiment of the present invention. The coil component 201 shown in FIG. 6 is different from the coil component 101 in that the insulator 31 is replaced with an insulating layer 41. The coil component 201 shown in FIG. 6 may include the insulating layer 41 in place of the magnetic layer 15 or include the insulating layer 41 on the top-side or bottom-side surface of the magnetic layer 15. The insulating layer 41 may extend in the direction of the L axis from the first end surface 10c to the second end surface 10d and in the direction of the W axis from the first side surface 10e to the second side surface 10f.

Since the insulating layer 41 is provided as one of the layers constituting the laminated structure of the base body 10, the electrical insulation can be more reliably established between the lead-out conductor 26 and the coil conductor 25. In addition, since the insulating layer 41 is formed as one of the layers constituting the laminated structure of the base body 10, the insulating layer 41 can be more easily manufactured than the insulator 31, which occupies only a portion of a planar region in the base body 10.

Figure 7:
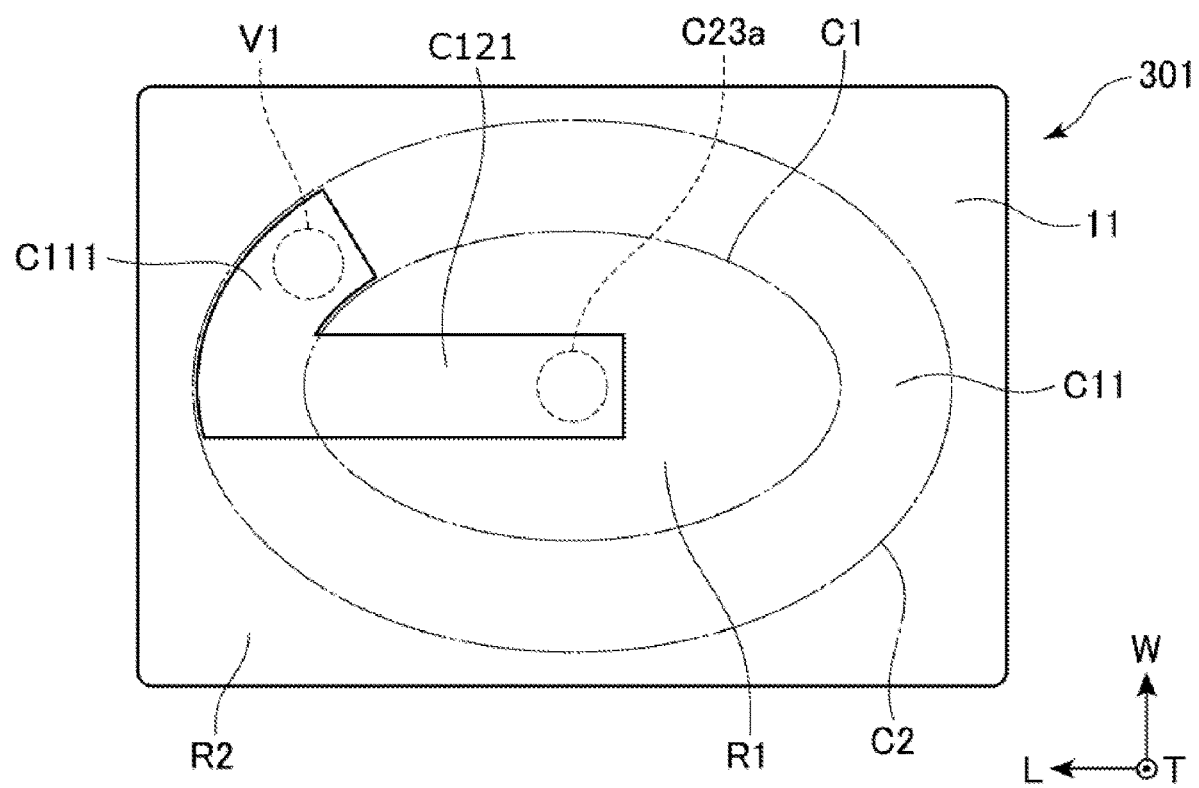
FIG. 7 is a plan view schematically showing a planar lead-out portion and a portion of a coil conductor provided in a magnetic layer included in a coil component relating to another embodiment of the present invention.

Next, with reference to FIG. 7, a description is given of a coil component 301 according to still another embodiment of the present invention. FIG. 7 shows a magnetic layer 11 included in the coil component 301 relating to still another embodiment of the present invention. FIG. 7 also shows a conductor pattern C111 and a planar lead-out portion C121, which are formed on the magnetic layer 11. The coil component 301 is different from the coil component 1 in that it includes the conductor pattern C111 in place of the conductor pattern C11 and the planar lead-out portion C121 in place of the planar lead-out portion C21, but may be configured in the same manner as the coil component 1 except for these differences. Therefore, FIG. 7 only shows the magnetic layer 11 and the following does not mention the magnetic layers 12 to 16 and the magnetic layers 19a to 19d.

As shown in the drawing, the planar lead-out portion C121 extends on the magnetic layer 11 from the top-side end C23a of the axial portion C23 toward the positive side in the L axis direction. The planar lead-out portion C121 is provided to overlap the planar lead-out portion C22 on the magnetic layer 16, when seen in the direction of the coil axis X. For example, the planar lead-out portion C22 and the planar lead-out portion C121 can be deemed to overlap each other when seen in the direction of the coil axis X, when the planar lead-out portions C121 and C22 are projected in parallel onto a projection plane perpendicular to the coil axis X and the overlapping region between the projected images on the projection plane is 80% or more.

Next, with reference to FIGS. 8A to 8G, a description is given of a coil component 401 according to still another embodiment of the present invention. The coil component 401 shown in FIGS. 8A to 8G is mainly different from the coil component 1 in that the axial portion C23 of the lead-out conductor 26 is replaced with an axial portion C223 and the external electrodes 21 and 22 are replaced with external electrodes 221 and 222.

As shown in FIGS. 8A to 8E, a coil layer 20 of the coil component 401 includes magnetic layers 11 to 15. On the magnetic layer 11, a conductor pattern C211 and a planar lead-out portion C221 are provided. On the magnetic layers 12 to 15, coil conductors C12 to C15 are formed. Each of the conductor patterns C211 and C12 to C15 is connected to adjacent conductor patterns in the stacking direction through the vias V1 to V4. The lead-out conductor 27 extends along the coil axis X from one of the ends of the conductor pattern C15 to the external electrode 222.

The planar lead-out portion C221 extends toward the first region R1 from the end of the conductor pattern C211 that is opposite to the end connected to the via V1. The axial portion C223 extends in the direction along the coil axis from the end of the planar lead-out portion C221 that is opposite to the connection with the conductor pattern C211. A through hole is formed in each of the magnetic layers 11 to 15 and the magnetic layers 19a to 19d, and an axial portion C223 penetrates through this through hole. The axial portion C223 extends from the planar lead-out portion C221 to the external electrode 221.

Figure 8A:
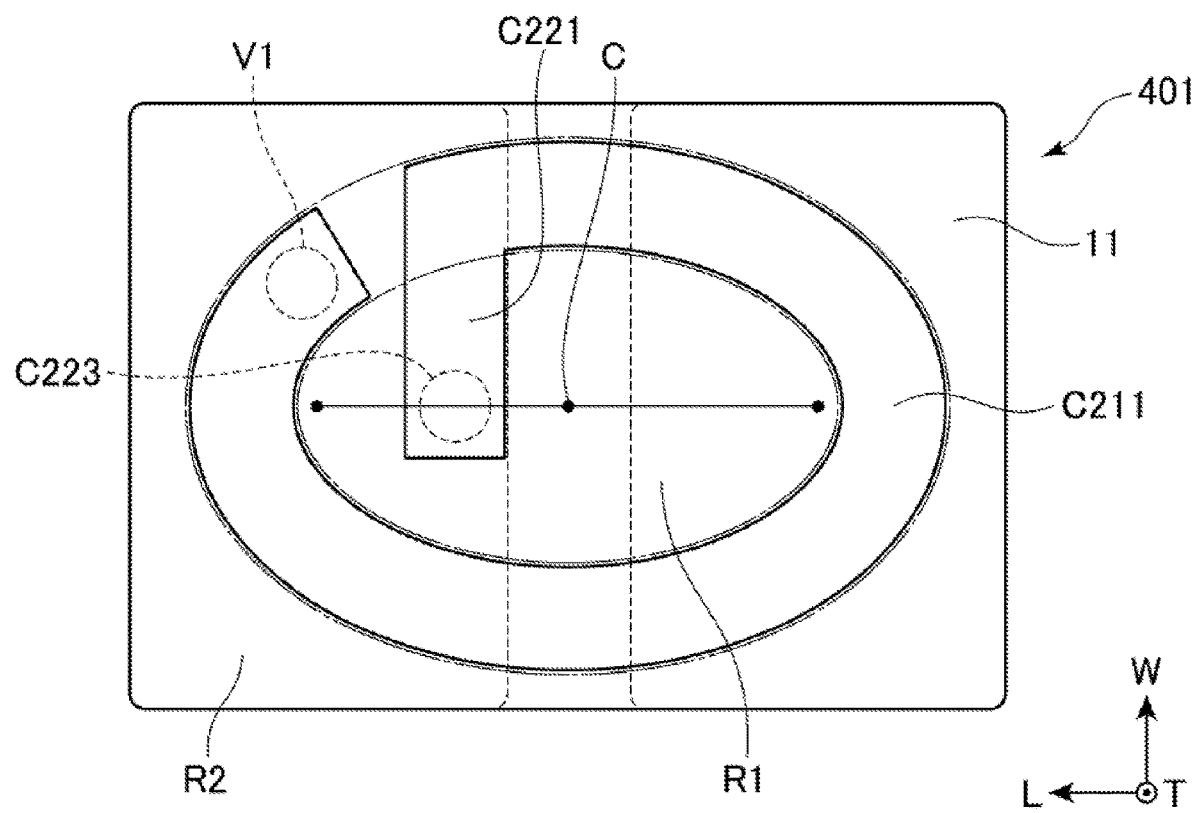
FIG. 8A is a plan view schematically showing a magnetic layer included in a coil component relating to another embodiment of the present invention.
Figure 8B:
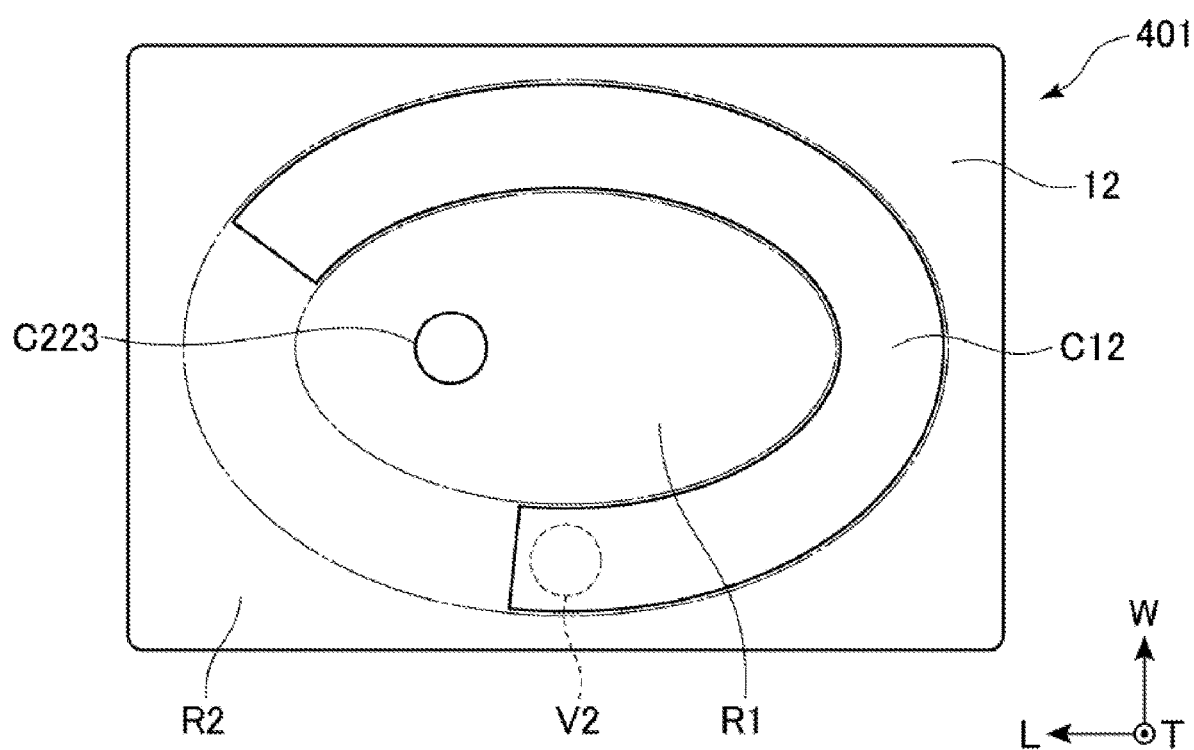
FIG. 8B is a plan view schematically showing a magnetic layer included in a coil component relating to another embodiment of the present invention.
Figure 8C:
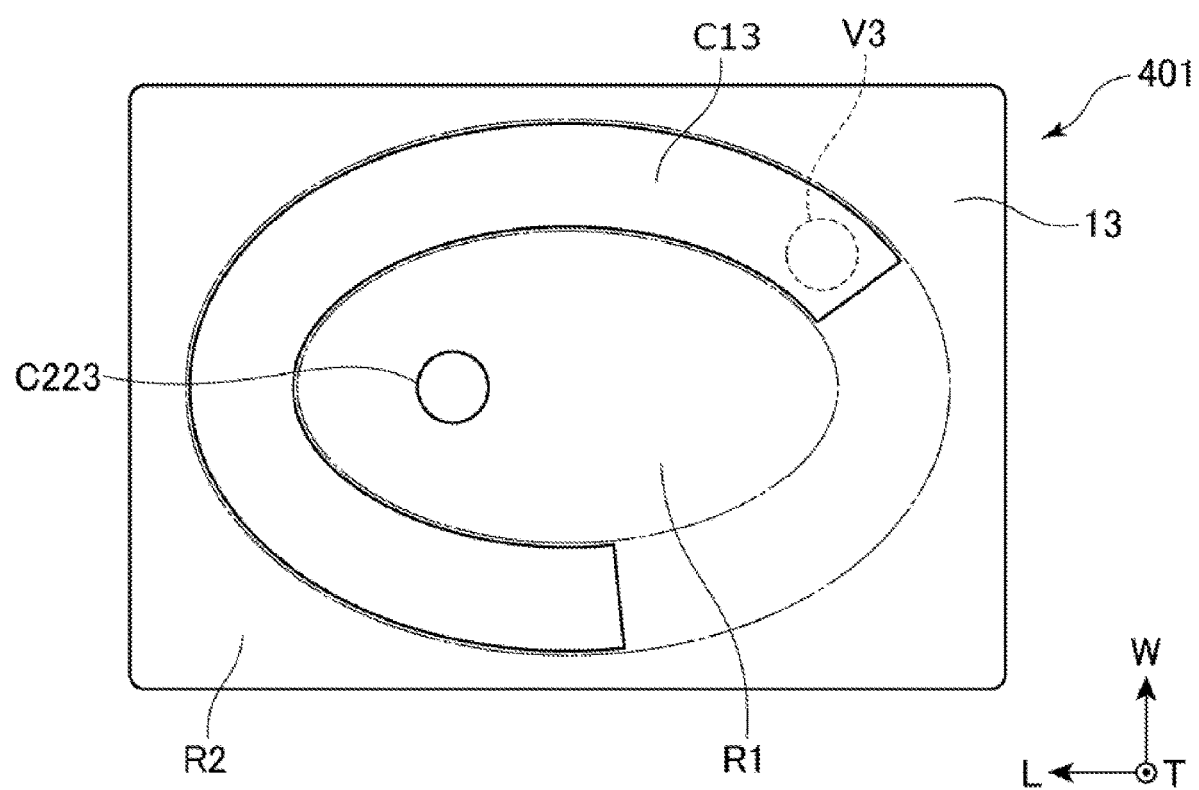
FIG. 8C is a plan view schematically showing a magnetic layer included in a coil component relating to another embodiment of the present invention.
Figure 8D:
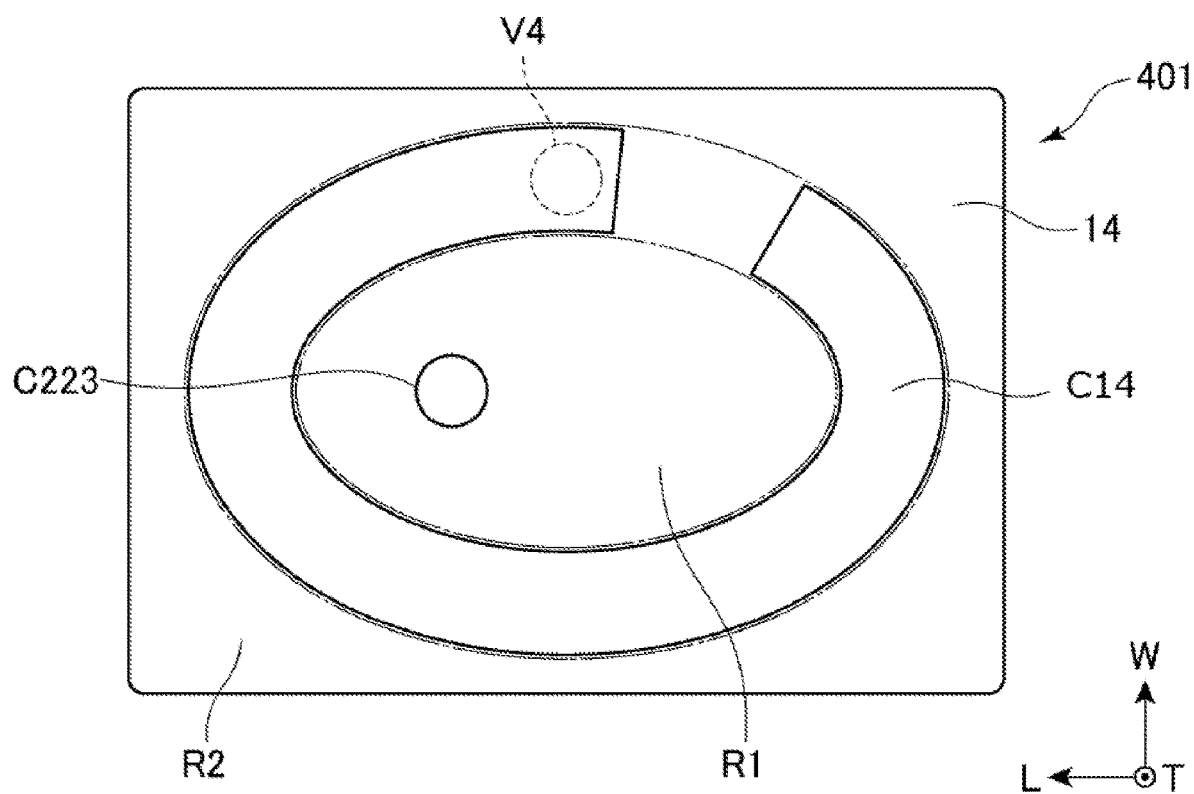
FIG. 8D is a plan view schematically showing a magnetic layer included in a coil component relating to another embodiment of the present invention.
Figure 8E:
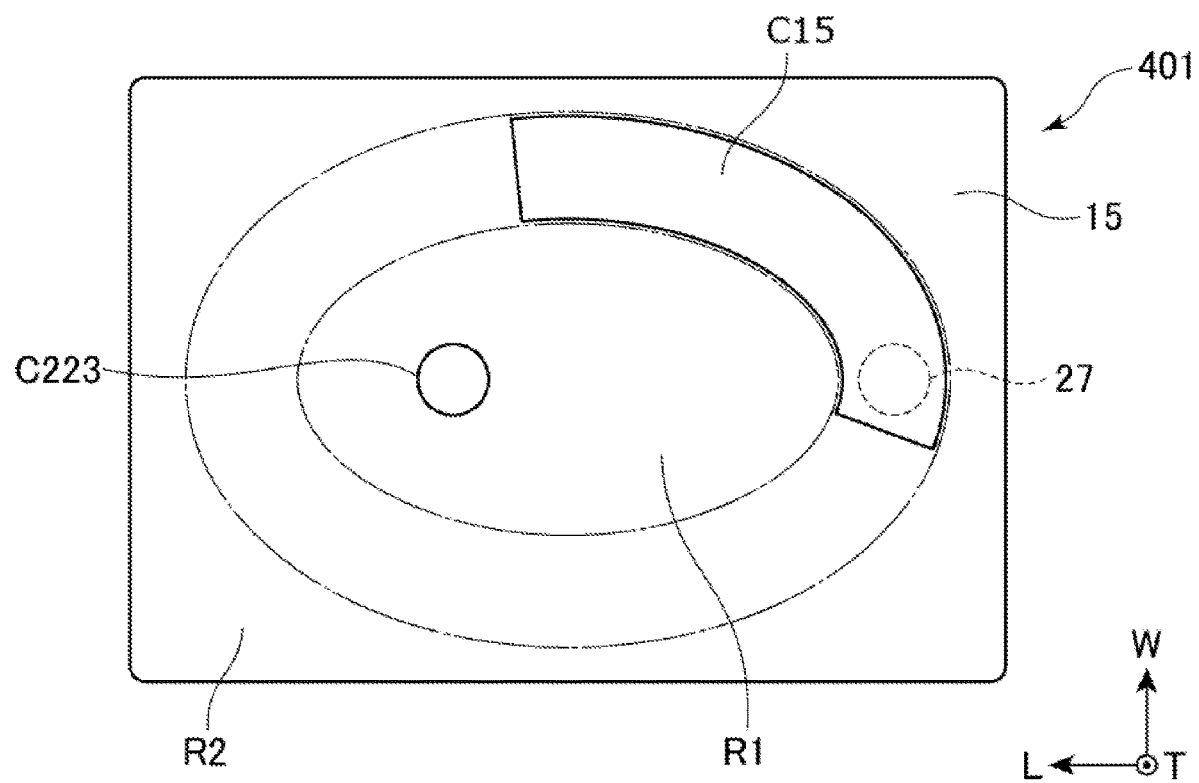
FIG. 8E is a plan view schematically showing a magnetic layer included in a coil component relating to another embodiment of the present invention.
Figure 8F:
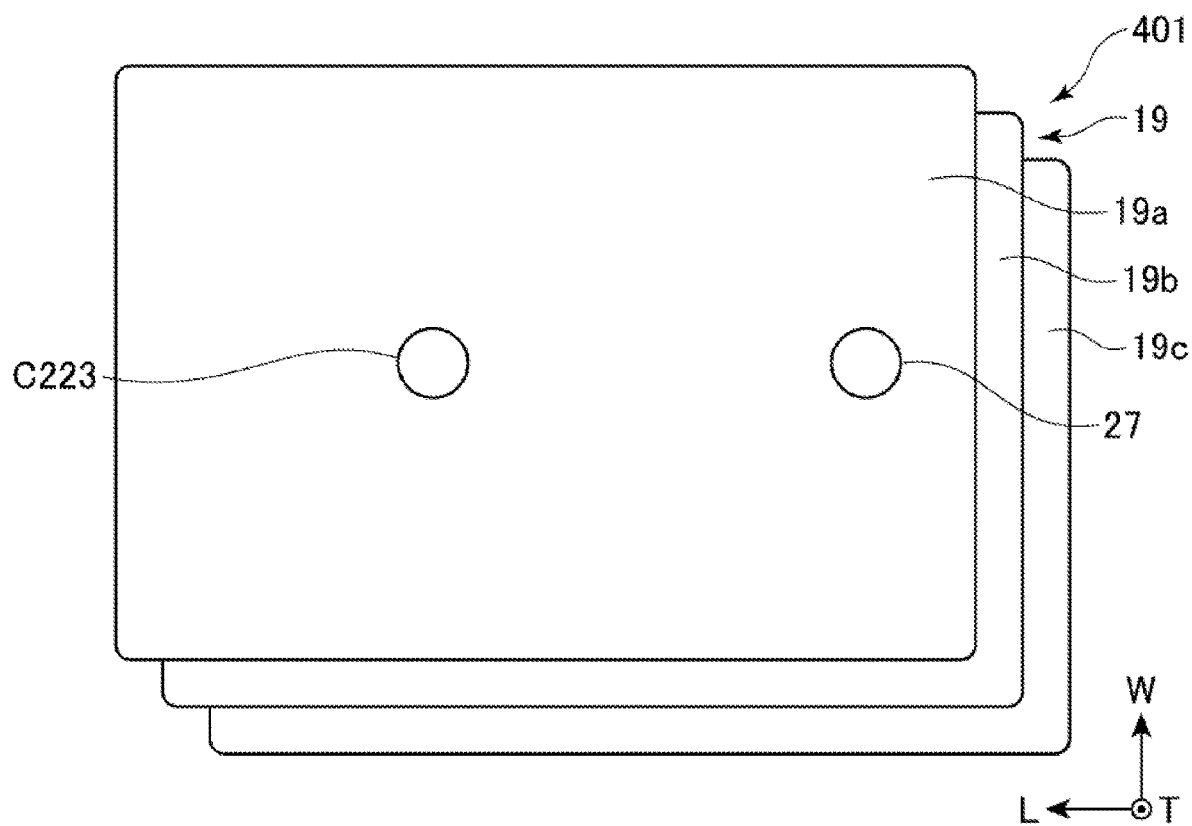
FIG. 8F is a plan view schematically showing a magnetic layer included in a coil component relating to another embodiment of the present invention.

As shown in FIG. 8A, when seen in the direction of the coil axis X, the axial portion C223 is offset from the L-axis-wise center C of the base body 10 toward the positive side in the direction of the L axis. In the direction of the L axis, the external electrodes 221 and 222 are symmetrically configured and arranged with respect to the L-axis-wise center C of the base body 10 when seen in the direction of the coil axis X. Accordingly, the L-axis-wise center C of the base body 10 can be treated as the center between the external electrode 221 and the external electrode 222 when seen in the direction of the coil axis X. In other words, when seen in the direction of the coil axis X, the axial portion C223 is offset from the center between the external electrode 221 and the external electrode 222 toward the positive side in the L axis direction. This means that, when seen in the direction of the coil axis X, the axial portion C223 is offset from the center C between the external electrode 221 and the external electrode 222 to be closer to the external electrode 221.

Figure 8G:
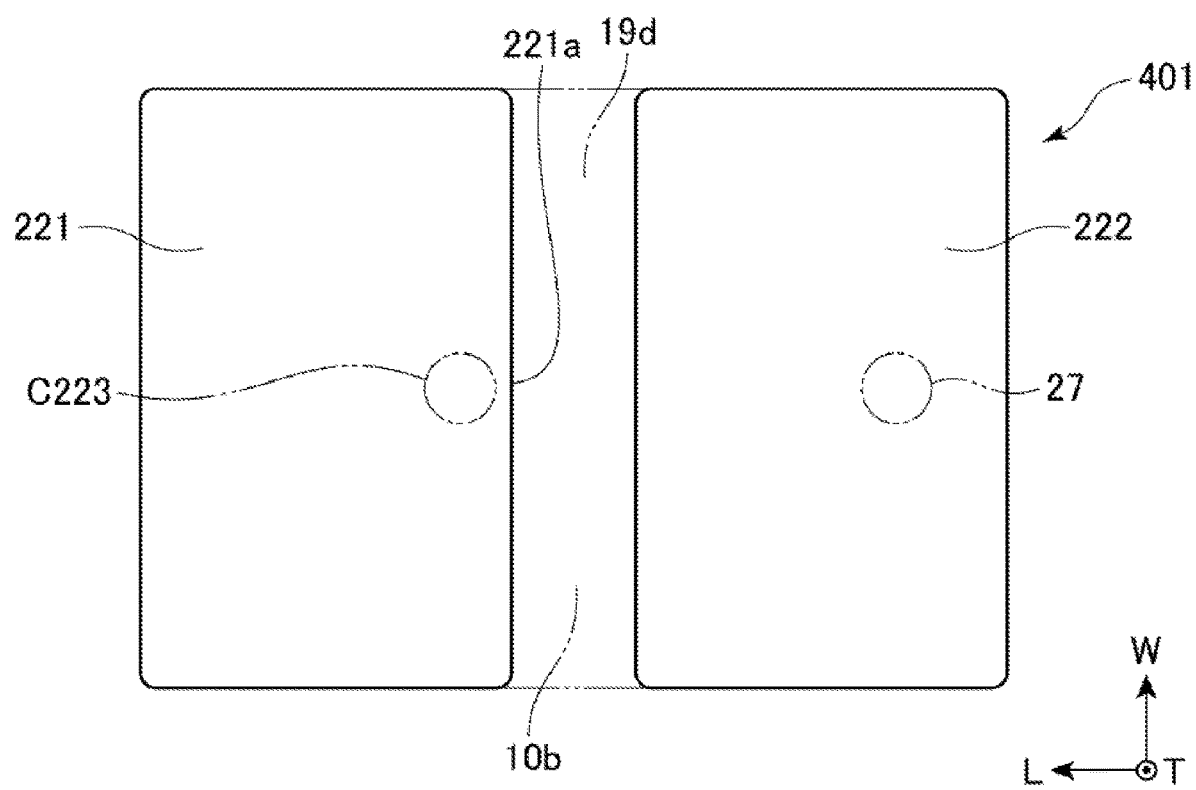
FIG. 8G is a plan view schematically showing a magnetic layer included in a coil component relating to another embodiment of the present invention.

In one embodiment, when seen in the direction of the coil axis X, the external electrode 221 is configured and arranged to overlap the axial portion C223, as shown in FIG. 8G. In one embodiment, the external electrode 221 is provided such that a side surface 221a of the external electrode 221 opposing the external electrode 222 is shifted toward the negative side in the direction of the L axis with respect to the axial portion C223 when seen in the direction of the coil axis X (shifted from the axial portion C223 toward the center C). Therefore, the axial portion C223 is directly connected to the external electrode 221 in the coil component 401. In other words, the axial portion C223 can be electrically connected to the external electrode 221 without the need of providing another lead-out conductor extending in the planar direction between the axial portion C223 and the external electrode 221.

In another embodiment, the external electrode 221 may be provided such that the side surface 221a of the external electrode 221 opposing the external electrode 222 overlaps the axial portion C223 or shifted toward the positive side in the direction of the L axis with respect to the axial portion C223 when seen in the direction of the coil axis X. In this case, in order to electrically connect the axial portion C223 and the external electrode 221, a planar lead-out portion is provided that extends from the axial portion C223 toward the external electrode 221 when seen in the direction of the coil axis X. This planar lead-out portion is used to electrically connect the axial portion C223 to the external electrode 221. Since the axial portion C223 is offset from the center C between the external electrode 221 and the external electrode 222 to be closer to the external electrode 221, the length of the planar lead-out portion between the axial portion C223 and the external electrode 221 may be smaller than that of the planar lead out portion (for example, the planar lead-out portion C22 shown in FIG. 3F) between the axial portion of the lead-out conductor and the external electrode when the axial portion is provided at the L-axis-wise center of the base body 10.

Figure 9:
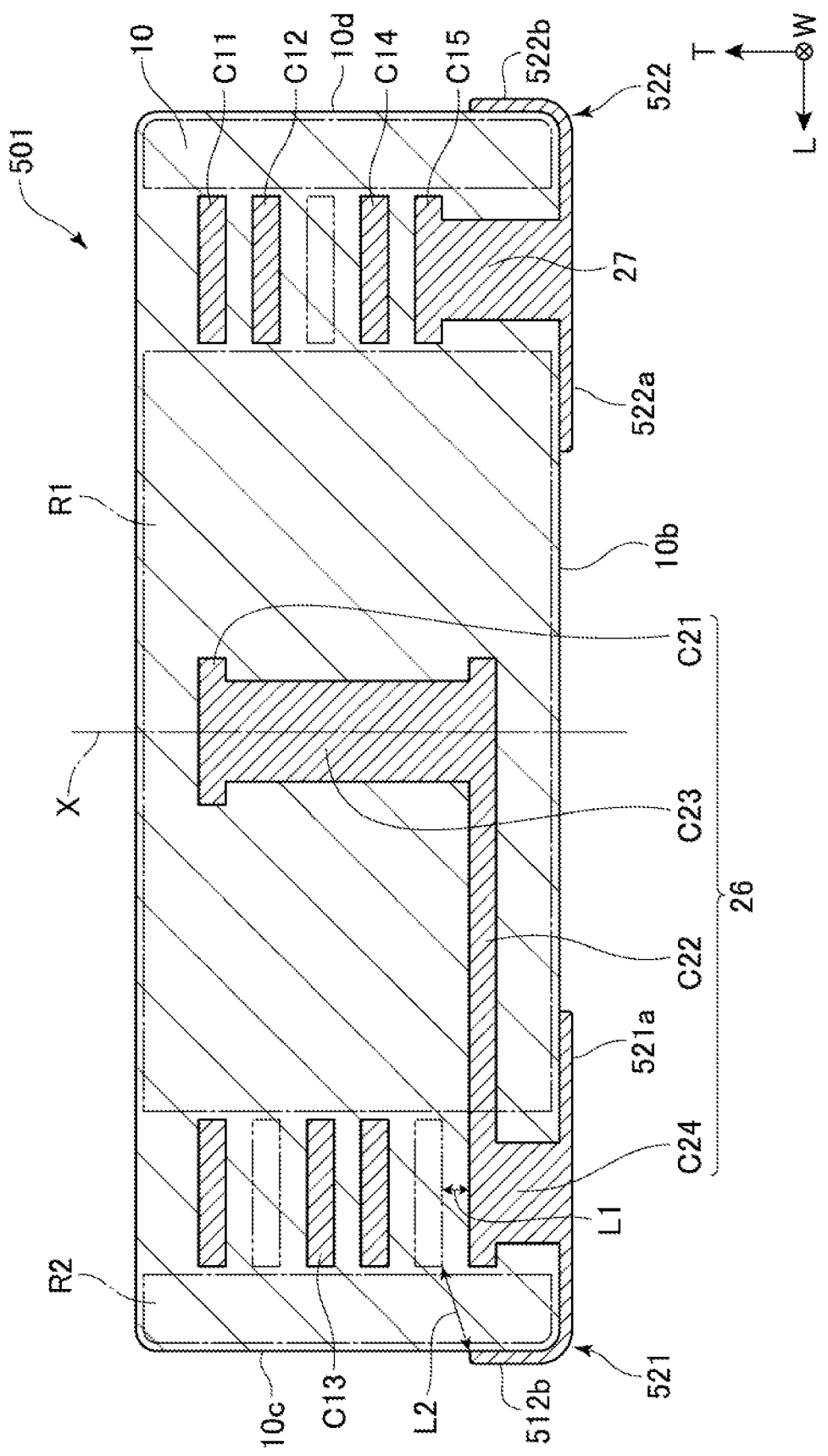
FIG. 9 is a cross-sectional view schematically showing the cross-section of a coil component relating to another embodiment of the present invention along the coil axis.

Next, with reference to FIG. 9, a description is given of a coil component 501 according to still another embodiment of the present invention. The coil component 501 shown in FIG. 9 is different from the coil component 1 in that the external electrode 21 is replaced with an external electrode 521 and the external electrode 22 is replaced with an external electrode 522.

In the illustrated embodiment, the external electrode 521 includes a main electrode portion 521a extending along the mounting surface 10b of the base body 10 and an auxiliary electrode portion 521b extending along the first end surface 10c of the base body 10. The external electrode 522 may have a main electrode portion 522a extending along the mounting surface 10b of the base body 10 and an auxiliary electrode portion 522b extending along the second end surface 10d of the base body 10.

The external electrode 521 is configured and arranged such that a distance L2 between the auxiliary electrode portion 521b and the coil conductor 25 is longer than a distance L1 between the planar lead-out portion C22 of the lead-out conductor 26 and the coil conductor 25. In the illustrated embodiment, the distance L2 between the auxiliary electrode portion 521b and the coil conductor 25 is the distance between the auxiliary electrode portion 521b and the conductor pattern C15. The distance L1 between the planar lead-out portion C22 of the lead-out conductor 26 and the coil conductor 25 is the distance between the planar lead-out portion C22 of the lead-out conductor 26 and the conductor pattern C15. The distance L1 between the lead-out conductor 26 and the coil conductor 25 is determined by the resistivity of the base body 10 such that no dielectric breakdown occurs between the lead-out conductor 26 and the coil conductor 25.

Next, advantageous effects of the foregoing embodiments will be described. In one of the embodiments described above, the lead-out conductor 26 is at least partially within the first region R1, which is inside the coil conductor 25 in the radial direction. This allows the coil conductor 25 to have a larger diameter, when compared with the case where the lead-out conductor 26 is within the second region R2, which is outside the coil conductor 25 in the radial direction. In a conventional coil component having a lead-out conductor arranged outside a coil conductor, it is required to ensure the insulation between the lead-out conductor and the coil conductor. For this reason, the distance between the coil conductor and the lead-out conductor arranged outside the coil conductor may be set large to such an extent that insulation can be reliably achieved, but this disadvantageously increases the area of the second region radially outside the coil conductor. As a result, it is difficult to increase the area of the first region radially inside the coil conductor. Accordingly, the ratio in area of the first region to the second region outside the coil conductor in the radial direction is generally 0.5 or lower for the conventional coil component. In the embodiments described above, on the other hand, there is no need of providing a space to provide a lead-out conductor radially outside the coil conductor 25. This allows the coil conductor 25 to have a large diameter and can thus increase the area of the first region when compared with the conventional coil component having the lead-out conductor arranged in the second region. In one embodiment of the present invention, the ratio in area of the first region R1 to the second region R2 is 0.6 or higher. The first region R1 can have a large area in this way since the lead-out conductor 26 is arranged in the first region R1. As described above, the ratio in area of the first region to the second region can be larger in the coil components relating to the above-described embodiments than in the conventional art. Accordingly, the magnetic flux concentration is reduced in the first region and magnetic saturation can be thus reduced.

In the coil component 101 relating to one of the embodiments described above, the insulator 31 is provided between the coil conductor 25 and the lead-out conductor 26. Since the insulator 31 is provided in the portion between the coil conductor 25 and the lead-out conductor 26, where a large difference in potential can be exhibited, dielectric breakdown can be effectively prevented in the base body 10 in the region between the coil conductor 25 and the lead-out conductor 26. The coil component 201 relating to another embodiment of the present invention includes the insulating layer 41. The insulating layer 41 can be formed using a simpler manufacturing procedure than the insulator 31. Specifically, while the insulator 31 occupies a portion of a given layer and thus requires a complex procedure to form the given layer, the insulating layer 41 extends across the entire layer and can be manufactured by making a simple change in the manufacturing step. Thus, the insulating layer 41, which can be manufactured using a simple manufacturing step, prevents dielectric breakdown in the base body 10 in the region between the coil conductor 25 and the lead-out conductor 26.

In one of the embodiments described above, the external electrodes 21 and 22 are in contact with the base body 10 only on the mounting surface 10b and not in contact with the other surfaces (for example, the first end surface 10c and the like). This means that the first region can be increased so that magnetic saturation can be prevented even in a coil component having the external electrodes extending only on the mounting surface, which has strict restrictions placed on the positioning of the internal conductors (the coil and lead-out conductors).

In one of the embodiments described above, the external electrode 521 can achieve improved adhesive strength between the circuit board and the coil component 501 through the auxiliary electrode portion 521b provided on the end surface 10c of the base body 10. Furthermore, since the distance L2 between the auxiliary electrode portion 521b of the external electrode 521 and the coil conductor 25 is larger than the distance L1 between the lead-out conductor 26 and the coil conductor 25, dielectric breakdown can be prevented to occur between the external electrode 521 and the coil conductor 25 even with the provision of the auxiliary electrode portion 521b.

In one of the embodiments described above, the axial portion C223 of the lead-out conductor 26 is at a position offset from the center C between the external electrode 221 and the external electrode 222 to be closer to the external electrode 221. This can eliminate the need of the planar lead-out portion extending in the planar direction to connect the axial portion C223 and the external electrode 221, or can reduce the length of such a planar lead-out portion. The planar lead-out portion extending in the planar direction in the first region R1 hinders the magnetic fluxes running through the first region and around the coil conductor 25 and may accordingly reduce the inductance or cause magnetic saturation. The above-described embodiment can establish connection between the axial portion C223 and the external electrode 221 without the planar lead-out portion extending in the planar direction or reduce the length of the planar lead-out portion connecting the axial portion C223 to the external electrode 221. As a consequence, the above-described embodiment can prevent the reduction in inductance and the occurrence of magnetic saturation. In addition, such configuration can reduce the DC resistance of the coil conductor 25.

When the axial portion C223 of the lead-out conductor 26 is offset the center C between the external electrode 221 and the external electrode 222 to be closer to the external electrode 221, the distance between the lead-out conductor 26 and the coil conductor 25 is set to be equal to or larger than the above-described distance L1. In this way, even if the axial portion C223 is offset from the center C between the external electrode 221 and the external electrode 222, dielectric breakdown can be prevented between the axial portion C223 and the coil conductor 25.

In one of the embodiments described above, the planar lead-out portion C121 connects the top-side end C23a of the axial portion 23 to the coil conductor 25. The planar lead-out portion C121 overlaps the planar lead-out portion C22 connected to the bottom-side end of the axial portion 23 when seen in the direction of the coil axis X. As mentioned above, the planar lead-out portion extending in the planar direction hinders the magnetic fluxes running through the first region and around the coil conductor 25. Since the planar lead-out portion C22 overlaps the planar lead-out portion C121 in the above-described embodiment, the influence on the magnetic fluxes made by the planar lead-out portions C22 and C121 can be reduced.

The dimensions, materials, and arrangements of the constituent elements described herein are not limited to those explicitly described for the embodiments, and these constituent elements can be modified to have any dimensions, materials, and arrangements within the scope of the present invention. Furthermore, constituent elements not explicitly described herein can also be added to the embodiments described, and it is also possible to omit some of the constituent elements described for the embodiments.

What is claimed is:
1. A coil component comprising:
a base body having a mounting surface;
a coil conductor wound around a coil axis through a plurality of layers in the base body, the coil conductor having a first end and a second end, the second end being closer to the mounting surface than the first end is;
a first external electrode provided on the mounting surface;
a second external electrode provided on the mounting surface, the second external electrode being spaced from the first external electrode;
a first lead-out conductor connecting the first end of the coil conductor and the first external electrode;
a second lead-out conductor connecting the second end of the coil conductor and the second external electrode; and
an insulator disposed so as to cover an overlap region in which the first lead-out conductor overlaps the coil conductor when seen in the direction of the coil axis, the overlap region being positioned between the coil conductor and the first lead-out conductor in the direction of the coil axis, the insulator having a higher insulating property than other regions of the base body,
wherein at least a portion of the first lead-out conductor is positioned within a first region in the base body, and the first region is inside the coil conductor in a radial direction when seen in a direction of the coil axis.

2. The coil component of claim 1, wherein the first lead-out conductor is arranged in such a manner that the first lead-out conductor does not to overlap a second region in the base body, and the second region is outside the coil conductor in the radial direction when seen in the direction of the coil axis.

3. The coil component of claim 1, wherein a second region is outside the coil conductor in the radial direction when seen in the direction of the coil axis, and a ratio in area of the first region to the second region is 0.6 or higher.

4. The coil component of claim 1, wherein the first and second external electrodes are in contact with the base body only on the mounting surface.

5. The coil component of claim 1,
wherein at least one of the first and second external electrodes has a first main electrode portion extending along the mounting surface and a first auxiliary electrode portion extending along a first end surface of the base body that is connected to the mounting surface, and
wherein a distance between the first auxiliary electrode portion and the coil conductor is longer than a distance between the first lead-out conductor and the coil conductor.

6. The coil component of claim 1, wherein the first lead-out conductor has an axial portion extending along the coil axis in the first region.

7. The coil component of claim 6, wherein, when seen in the direction of the coil axis, the axial portion of the first lead-out conductor is offset from a center between the first external electrode and the second external electrode to be closer to the first external electrode.

8. The coil component of claim 6,
wherein the first external electrode overlaps the first lead-out conductor when seen in the direction of the coil axis, and
wherein the first lead-out conductor is connected at the axial portion thereof to the first external electrode.

9. The coil component of claim 6,
wherein the first lead-out conductor has a first connecting portion and a second connecting portion, the first connecting portion connects one end of the axial portion and the first end of the coil conductor, the second connecting portion connects the other end of the axial portion and the first external electrode, and the other end of the axial portion is closer to the mounting surface than the one end is, and
wherein the first connecting portion overlaps the second connecting portion when seen in the direction of the coil axis.

10. A circuit board comprising the coil component of claim 1.

11. An electronic component comprising the circuit board of claim 10.

* * * * *